United States Patent
Frost et al.

(10) Patent No.: US 8,234,739 B2
(45) Date of Patent: Aug. 7, 2012

(54) SPIRAL BRUSH FOR CLEANING AND CONVEYING A SUBSTRATE

(75) Inventors: Dave Frost, Scotts Valley, CA (US); Sean Harbison, Scotts Valley, CA (US); Yassin Mehmandoust, Scotts Valley, CA (US); Mike Forkapa, Scotts Valley, CA (US); Ken Miller, Scotts Valley, CA (US)

(73) Assignee: Xyratex Technology Limited (GB)

(*) Notice: Subject to any disclaimer, the term of this patent is extended or adjusted under 35 U.S.C. 154(b) by 1257 days.

(21) Appl. No.: 11/862,170

(22) Filed: Sep. 26, 2007

(65) Prior Publication Data
US 2008/0182488 A1    Jul. 31, 2008

Related U.S. Application Data

(60) Provisional application No. 60/827,886, filed on Oct. 3, 2006.

(51) Int. Cl.
*B08B 11/02* (2006.01)
(52) U.S. Cl. .................. 15/88.3; 15/77; 15/102
(58) Field of Classification Search ............. 15/77, 88.2, 15/88.3, 102, 182
See application file for complete search history.

(56) References Cited

U.S. PATENT DOCUMENTS

| | | | | |
|---|---|---|---|---|
| 2,682,679 A | * | 7/1954 | Ballard | 15/182 |
| 2,693,611 A | * | 11/1954 | Lombardi | 15/104.09 |
| 2,783,095 A | * | 2/1957 | Ballard | 300/21 |
| 3,237,228 A | * | 3/1966 | Smith | 15/3.1 |
| 4,372,004 A | * | 2/1983 | Vermillion | 15/182 |
| 4,773,114 A | * | 9/1988 | Thrasher | 15/21.2 |
| 4,777,691 A | * | 10/1988 | Richmond et al. | 15/182 |
| 4,902,263 A | | 2/1990 | Ito et al. | |
| 5,862,560 A | | 1/1999 | Jensen et al. | |
| 2002/0170571 A1 | | 11/2002 | Egashira et al. | |

* cited by examiner

*Primary Examiner* — Randall Chin
(74) *Attorney, Agent, or Firm* — Womble Carlyle Sandridge & Rice, LLP

(57) ABSTRACT

Scrubbing apparatus is configured by methods so that discs are quickly cleaned and conveyed by selecting a total number of spiral brush segments, rates of brush rotation, and a pitch length of a helical junction that receives discs for cleaning and transport. A time period for cleaning and transporting discs depends on the pitch length, rotational speed and configurations of the segments. An increase of the cleaning time period may result from use of an increased number of brush segments. A group of discs is cleaned by the same spiral brush, by one-by-one insertion of the discs into the junctions, and transporting the discs through the same segments.

23 Claims, 22 Drawing Sheets

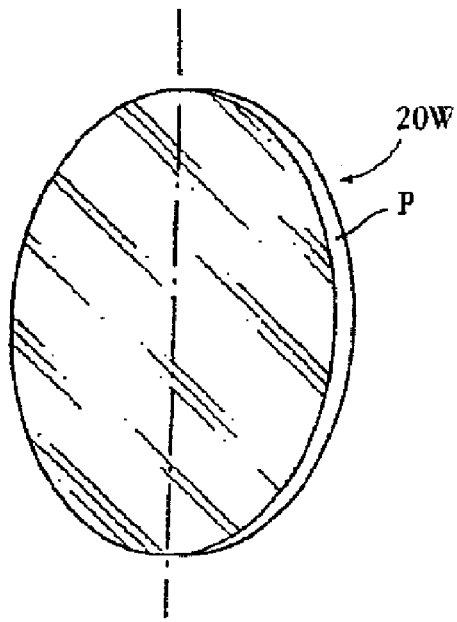
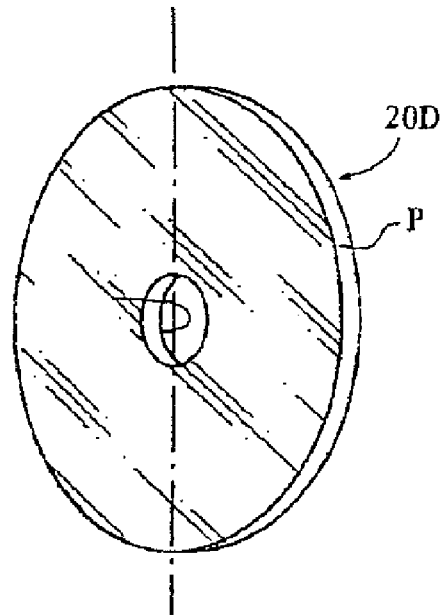
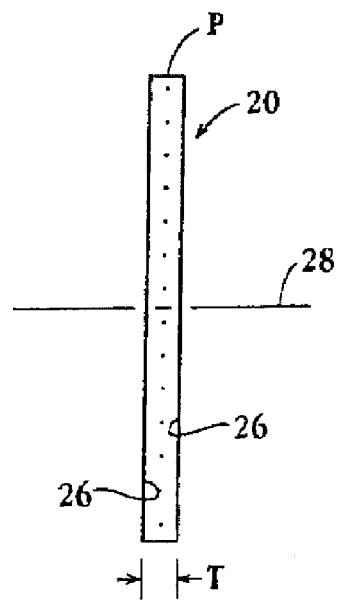
Fig. 1A          Fig. 1B
Fig. 1C

SPIRAL BRUSH FOR CLEANING AND CONVEYING A SUBSTRATE

CLAIM OF PRIORITY

This application claims priority from U.S. provisional application for patent No. 60/827,886, filed on Oct. 3, 2006, and entitled "BRUSH, METHODS FOR MAKING THE BRUSH, AND APPARATUSES FOR CLEANING AND CONVEYING A SUBSTRATE", which provisional application is hereby incorporated by reference.

BACKGROUND

Many processes for semiconductor and disk manufacturing require extremely clean workpieces before the processes may start. For example, particulates or contaminates that attach to or form on the workpiece before processing may eventually cause defects in the workpiece. When the workpieces are disks to be processed, such particulates or contaminates may be hydrophobic or hydrophilic, and may include layers: e.g., thin oxide surface layers; surface asperities such as scratches, nodules, and ridges that may be induced by a prior polishing operation; materials adhered to the workpiece due to the polishing operation; and loosely adhered particles from the environment in which the workpiece has been stored. These particulates or contaminates may also be aged, and thus be more stable and more difficult to remove before the processing. Cleaning, then, is a process intended to remove substantially all of such particulates or contaminates from workpieces before processing, such as processing of magnetic media or semiconductor workpieces. A clean workpiece is thus a workpiece from which substantially all of such particulates or contaminates have been removed before processing.

Therefore, there is a need for improving techniques for cleaning workpieces, such as those workpieces that present problems and require removal of substantially all of such particulates or contaminates from the workpieces before processing. Moreover, these improved techniques must allow cleaning of a workpiece to be done quickly so as to reduce the cost of capital equipment for the cleaning.

What is needed then, is apparatus configured to clean workpieces quickly, yet during the cleaning operation of one workpiece, to increase the time provided for contact at the brush-workpiece interface according to characteristics of the workpiece. What is also needed is apparatus configured to clean a group of workpieces, wherein all workpieces of the group are cleaned by the same apparatus, e.g., by the same brush.

SUMMARY

Broadly speaking, embodiments of the present invention fill these needs by providing methods of and apparatus configured to clean workpieces quickly, yet during the cleaning operation of one workpiece, to increase contact time at the brush-workpiece interface; and by providing methods for making a spiral brush for conveying and cleaning a group of workpieces, wherein the brush is configured so that all the workpieces of the group are cleaned by the same brush.

Embodiments of the present invention may provide a brush having a spiral configuration for scrubbing a workpiece having opposite sides, the brush including a brush member configured from a scrubbing material and having an axis of rotation. The member may be configured with a slit extending along a helical path relative to the axis of rotation. The slit may be configured to define opposed helical scrubber surfaces, the opposed helical scrubber surfaces being configured to receive the workpiece.

Embodiments of the present invention may also provide a brush segment for scrubbing a workpiece. The brush segment may include a vane extending helically around an axis of rotation and radially away from the axis to define first and second opposite helical sides. A first brush member may be configured extending helically adjacent to the first helical side. A second brush member may be configured extending helically adjacent to the second helical side.

Embodiments of the present invention may further provide a brush for scrubbing a workpiece, wherein a first brush segment and a second brush segment of the above-described brush segments may be used. Each vane may be configured with a hub co-axial with the axis. With the respective hubs of the first brush segment and the second brush segment abutting, the vanes of the first and second brush segments may define a continuous vane member extending helically in a plurality of adjacent turns around the axis. Each of the vanes may be further configured with a particular pitch length to define a given space between adjacent turns of the continuous vane member. The first brush member of the first brush segment and the second brush member of the second brush segment may be received in the space between the adjacent turns of the continuous vane member and define a helical scrubber junction as a continuous helical scrubber junction between the first and second brush segments.

It will be obvious; however, to one skilled in the art, that embodiments of the present invention may be practiced without some or all of these specific details. In other instances, well known process operations have not been described in detail in order not to obscure the present invention.

DESCRIPTION OF THE DRAWINGS

Aspects of the present invention will become apparent from the following detailed description, taken in conjunction with the accompanying drawings, illustrating by way of example the principles of embodiments of the present invention.

FIG. 1A is a view of a workpiece configured as a wafer, such as a semiconductor wafer, or as a substrate, that may be cleaned in accordance with embodiments of the invention.

FIG. 1B is a view of a workpiece configured as a disc, such as a disc for use in magnetic recording, that may be cleaned in accordance with embodiments of the invention.

FIG. 1C is an end view showing an axis and a thickness of a workpiece to be cleaned in accordance with embodiments of the invention.

DETAILED DESCRIPTION

Figure 2A:
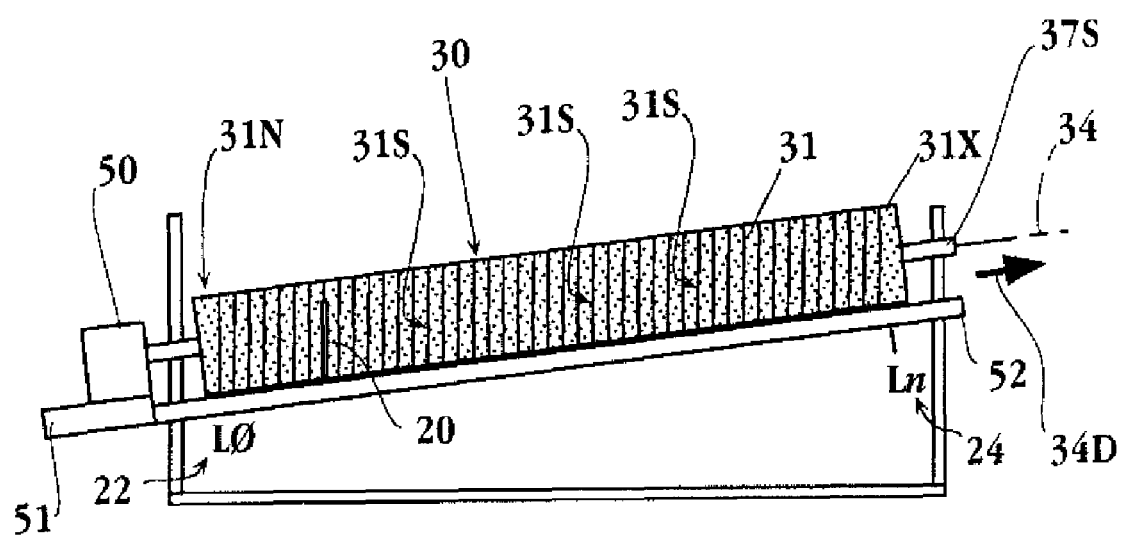
FIG. 2A is a side view of a spiral brush of one embodiment of the present invention for simultaneously cleaning disc-shaped workpieces and conveying the workpieces from an entrance to an exit.

The embodiments described below relate to apparatus for cleaning and conveying a workpiece. In one embodiment, the apparatus may be used to clean magnetic disks that store data. It should be appreciated that the embodiments are not limited to cleaning and conveying magnetic disks, in that any semiconductor circuit device, flat panel display, or other substrate may be cleaned and conveyed by the embodiments described herein. The term workpiece as used herein may refer to any substrate being processed. In addition, the terms disk and disc are used interchangeably, and may also reference any such substrate or workpiece.

Embodiments of the present invention provide apparatus configured to clean workpieces quickly, yet during the cleaning operation of one workpiece, the configuration increases the time period during which there is contact at a brush-workpiece interface. The embodiments also provide apparatus to provide such configuration; and to provide a configuration in which all workpieces of a group are cleaned by the same apparatus, e.g., by the same brush. Through a helical arrangement, the brush is configured to convey the workpiece and scrub the workpiece simultaneously. It should be appreciated that the present invention may be implemented in numerous ways, such as a process, an apparatus, a system, a device or a method. Several inventive embodiments of the present invention are described below.

Applicants' Analysis of the Problem

The Applicants of the present application (herein "Applicants") have determined that to meet the above-discussed more difficult removal problems, in some situations more time should be spent cleaning the workpiece. For example, such determinations include that when a brush is used for the cleaning, in general more time should be provided for contact at an interface of the brush and the workpiece (i.e., at a brush-workpiece interface). However, the need for more contact time at the brush-workpiece interface conflicts with the need for the cleaning of the workpiece to be done quickly. Also, Applicants have determined that it is desirable to have each workpiece, of a group of workpieces to be cleaned, be cleaned by the same brush and still have more time for contact at a brush-workpiece interface. In this manner, workpiece uniformity would be fostered, and would be preferable over the batch cleaning described below in which a different brush is used to clean each workpiece of the group. Additionally, Applicants have determined that it is desirable to fill the above needs while subjecting the workpieces and the brush to selective cleaning operations, where the selection may be at different angular locations around the brush and/or at different axial locations along the brush, for example.

Detailed Description of the Embodiments

Referring to FIGS. 1A-1C and 2A, in a general sense, embodiments of the present invention (herein referred to as "embodiments") may both clean an above-described substrate or workpiece, such as a disc-shaped member, or disc, collectively referred to as a disc, 20 and transport, or convey, the disc from a disc entrance 22 to a disc exit 24. Exemplary discs may be a semiconductor wafer or substrate 20W (FIG.

1A) on which layers are to be deposited, or a magnetic media disc 20D (FIG. 1B), for example. FIG. 1C shows the disc 20 configured with spaced planar surfaces, or sides, 26 on which either the materials of the magnetic media disc 20D are provided, or on which the layers of the wafer 20W are to be deposited. The sides 26 define a thickness T, and are to be cleaned by the apparatus that may be made by methods of the present invention. The disc may have an axis 28 of rotation. A perimeter P of the disc 20 may extend around the axis 28. The disc 20D may be provided with a central aperture, and each disc 20 may have a radius of a standard value such as 300 mm (disc 20W) or 95 mm (disc 20D).

FIG. 2A shows that a spiral brush 30, also referred to as a spiral scrubber, is elongated and extends from the disc entrance 22 to the disc exit 24. Embodiments of the spiral brush 30 may be configured in one piece (e.g., shown as brush 30-1, FIGS. 2A-2F), or may be configured from a series of spiral (or helical) brush segments 32 (e.g., segments 32-2, FIGS. 3D & 3E; segments 32-3, FIG. 5C, & segments 32-4, FIG. 6A). In these embodiments, each inserted disc 20 is inserted into and firmly (tightly) received in a spiral (or helical) slit. One embodiment of the slit in the one piece spiral brush 30 is referred to by the reference number 31 (e.g., FIGS. 2A & 2B), and aspects of such slit 31 are referred to below as 31S, 31N, & 31X (e.g., in reference to FIG. 2A). Another embodiment of the slit 31 is referred to by the reference number 48 and is formed between adjacent brush segments (e.g., 32V and 32W, FIG. 3D). Slit 48 may also be referred to as a helical or spiral slit, or junction, or scrubber junction. A further embodiment of the scrubber junction 48 is formed between adjacent brush segments (e.g., 32A and 32B, FIG. 5C). Contact areas of the junctions are referred to by the reference number 48S-1 and 48S-2 shown in FIG. 5C. A still further embodiment of the scrubber junction 48 is formed between adjacent brush segments 32-4 shown in FIG. 6A.

The spiral brush 30-1 and slit 31 are described first below with respect to one exemplary disc 20 shown in FIG. 2A received in the slit. Further below, the spiral brush 30-1 and slit 31 are described with respect to many exemplary discs 20 received in the slit (FIG. 2D). For the cleaning and conveying, the spiral brush 30-1 is rotated around a brush axis 34 that is almost parallel to the disc axis 28, and the brush is mounted against movement parallel to that axis 34. The exemplary one inserted disc 20 shown in the cross-sectional view of FIG. 2C is mounted to facilitate the cleaning and conveying. The mounting of the disc 20 restrains the disc vertically, but allows free rotation of the disc and conveying of the disc parallel to the brush axis 34. The mounting for free rotation is mounting with freedom of the disc 20 to rotate around the disc axis 28 while being held in a generally vertical orientation by opposed scrubber surfaces 36 of the helical slit 31 (e.g., FIG. 2C), or of the junction 48 embodiment of the slit (e.g., FIGS. 3D & 5C). FIG. 2C shows that in one embodiment the mounting for conveying of the disc 20 is an exemplary mounting with freedom of the disc to move in the direction 34D of the brush axis 34 toward the disc exit 24, which is a direction of the conveying of the disc 20.

Figure 2B:
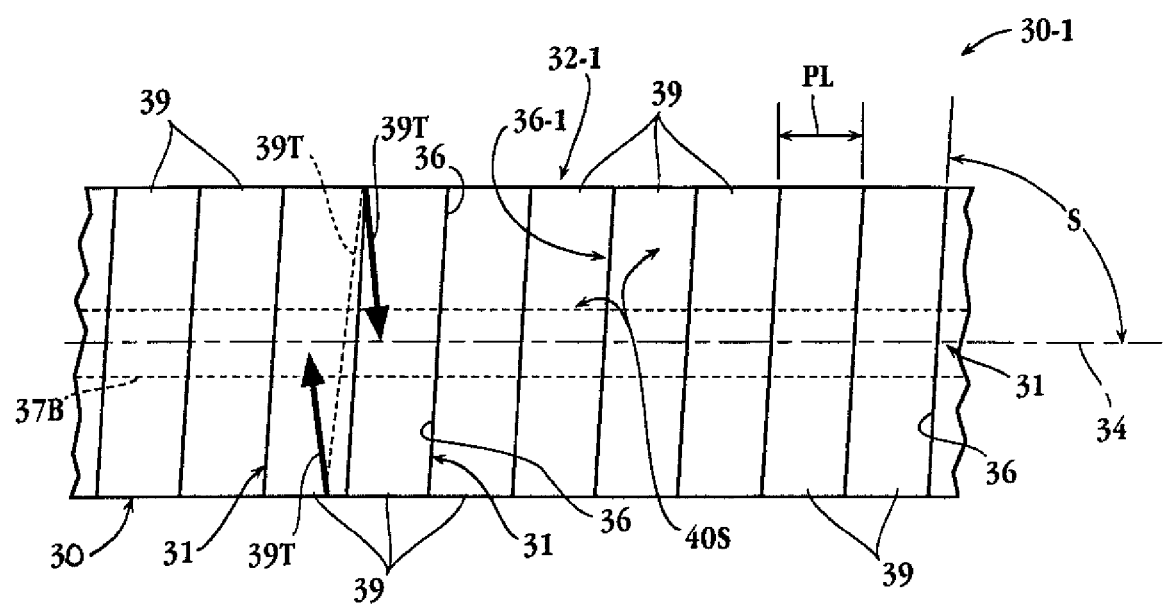
FIG. 2B is an enlarged view of a portion of the brush shown in FIG. 2A, illustrating a slit for receiving, scrubbing and conveying the workpiece.
Figure 2C:
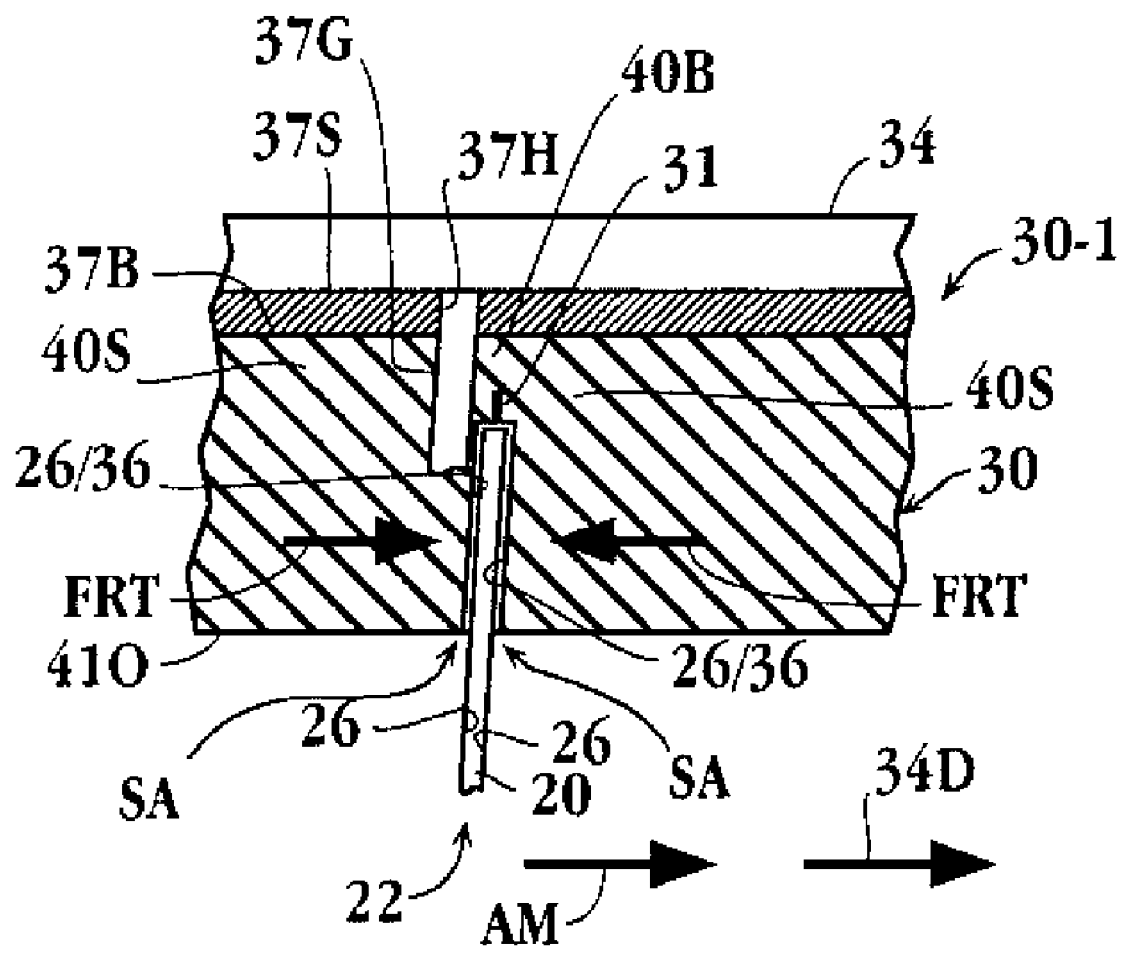
FIG. 2C is an enlarged view of a portion of the brush shown in FIG. 2B, illustrating a workpiece received in the slit.
Figure 2D:
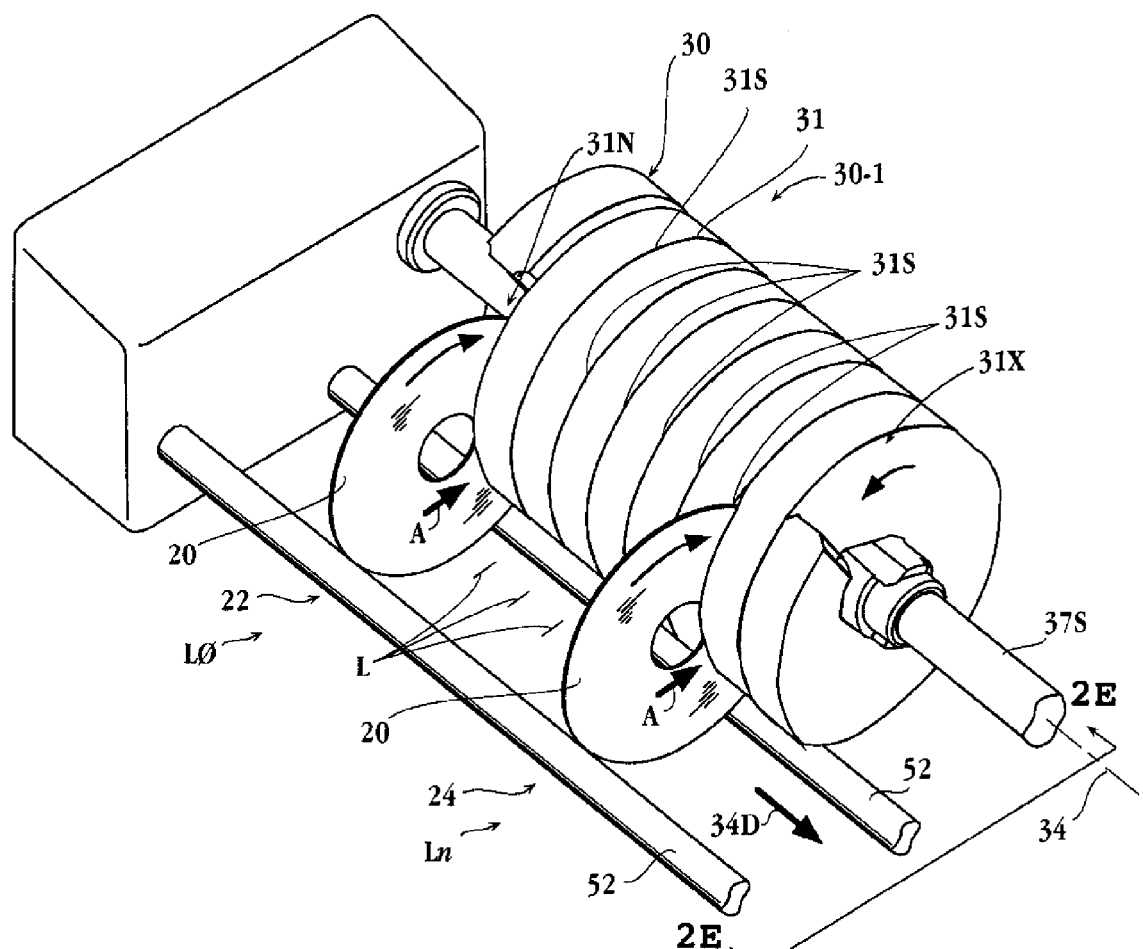
FIG. 2D is a view of the spiral brush shown in FIG. 2A, illustrating an entrance of the brush configured to guide a workpiece into the slit.

FIGS. 2A-2F illustrate one embodiment of the brush 30 (referred to as brush 30-1) for scrubbing the disc 20 having the opposite sides 26. Generally, this brush 30-1 may have a spiral configuration, and may be configured with a one piece brush member configured with respect to the axis 34 of rotation. The member may be further configured with the helical slit 31 extending along a continuous helical path relative to the axis 34 of rotation and with a pitch length PL (FIG. 2B). The continuous helical path extends from the disc entrance 22 to the disc exit 24. FIGS. 2B & 2C show that the helical slit 31 may be configured to define the opposed helical scrubber surfaces 36. FIG. 2C shows that the helical slit 31 may be configured to receive and scrub the disc 20 between the helical scrubber surfaces 36. The brush 30-1 may be configured from resilient material. The surfaces 36 may thus contact and scrub the sides 26 of the received disc 20, applying scrubbing forces FRT to the sides 26 as shown in FIG. 2C, in which the contacting side and surface are indicated by "26/36". An area SA of the contacting of such disc side 26 and scrubber surface 36 is described below with respect to FIG. 2E. As the brush 30-1 rotates around the axis 34, a net force is applied to the disc 20 in the direction 34D to convey the disc 20 in the direction 34D during the brushing as shown in FIG. 2D.

FIG. 2B shows the helical scrubber surfaces 36 configured at an angle S that is between each of the adjacent scrubber surfaces 36 and the brush axis 34. The angle S is thus also between the slit 31 (i.e., the helical path of the helical slit) and the brush axis 34 and is proportional to the pitch length PL. The value of the angle S is less than 90 degrees, and may be in a range from about 89 to about 45 degrees.

FIG. 2D shows that at the entrance end 22 the helical slit 31 may be further configured with a first of many portions of the slit (referred to as slit portions). Generally, the portions extend less than 360 degrees around the axis 34. The slit portions may include a slit entrance portion 31N, a slit exit portion 31X, and slit scrubber portions 31S. Each such portion may be described with respect to (1) a location L parallel to (or along) the brush axis 34; and (2) a rotational location A around the axis 34 (as defined by an angle AA counterclockwise from vertical in FIG. 2E). Each portion is an arcuately-short section of the continuous helical slit 31, and is centered at the location A around the axis 34. The different portions are at different axial locations L along the axis 34 (e.g., 31N at L0, 31X at Ln, and 31S at different locations L in FIG. 2D).

The slit 31 is configured with the slit entrance portion 31N to facilitate insertion of discs into the slit 31. In one embodiment, the slit entrance portion 31N may be wider than the thickness T, and may be tapered so that on counterclockwise rotation of the brush 30-1 (as viewed in FIG. 2D) the slit entrance portion 31N may readily receive (or guide) the disc into the continuous helical slit 31. At the exit end 24 the slit 31 is further configured with the slit exit portion 31X that may taper to be wider than the thickness T to facilitate easy removal of the disc from the slit 31. In another embodiment, the slit entrance portion 31N may be slightly narrower than the thickness T and still readily receive the disc 20 in the slit 31.

Figure 2E:
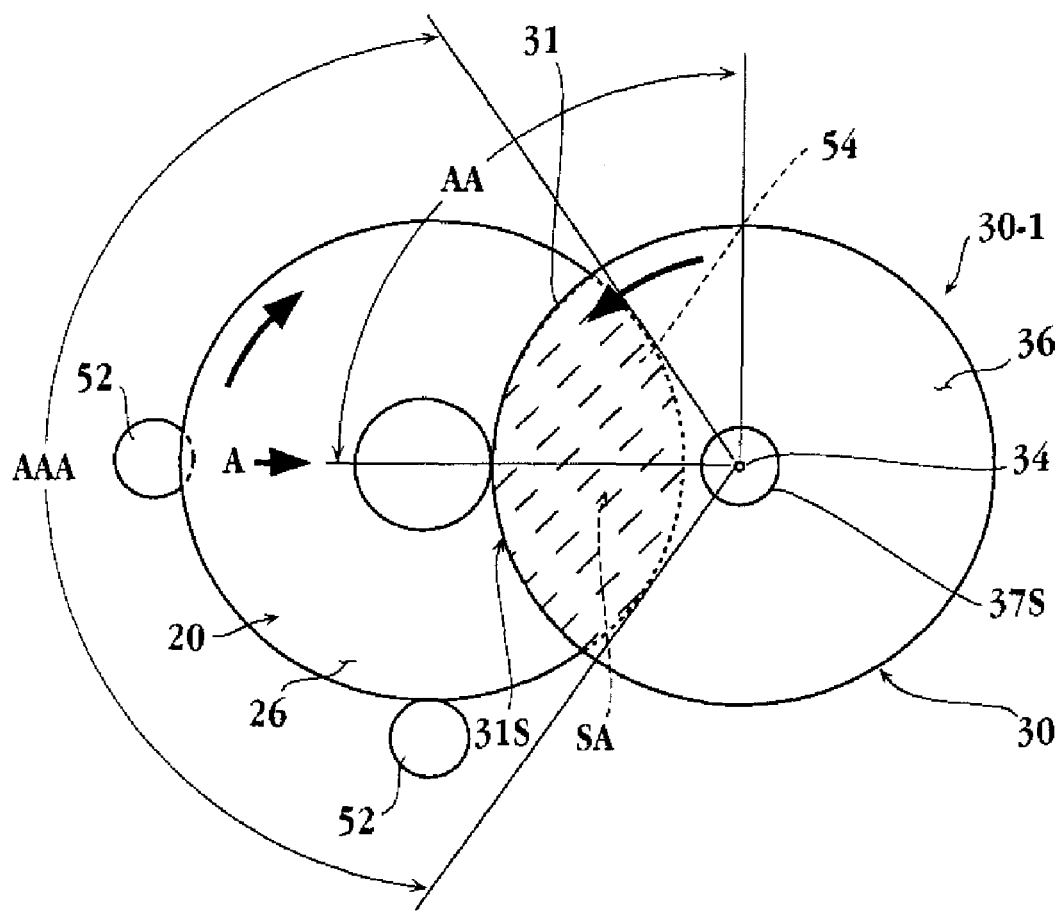
FIG. 2E is an end view of a spiral scrubber brush scrubbing a disc, illustrating an exemplary rotational location around an axis of the spiral scrubber brush at which the scrubbing takes place.

The slit scrubber portions 31S at locations L between the slit entrance portion 31N and slit exit portion 31X are generally at the rotational location A (FIG. 2E). These portions 31S may be understood from FIG. 2B that shows the spiral brush 30-1 configured with a bore 37B that is coaxial with the axis 34. FIG. 2A shows a shaft 37S configured for reception in the bore 37B to rotate the brush member around the axis 34. FIG. 2C shows the spiral brush 30-1 configured extending radially away from the shaft 37S to define the helical scrubber surfaces 36. FIG. 2E shows that with this configuration, at each respective axial location L and rotational location A of the spiral brush, one of the slit scrubber portions 31S of the helical slit 31 may receive, and the respective opposed scrubber surfaces 36 may contact, about one-third of the area of each of the opposite sides 26 of each disc 20 received in the slit 31 to effect the scrubbing of the sides 26. FIG. 2E shows the contact area SA between surfaces 36 and sides 26 shaded.

The shaft 37S is configured to rotate at a fixed axial location (e.g., fixed with respect to an axial location L0 of the slit entrance 31N, FIG. 2A), and rotates the spiral brush 30-1 at that fixed axial location. With the spiral brush 30-1 at that fixed axial location, and with the brush 30-1 and the slit 31 rotated by the shaft 37S in a counterclockwise direction around the axis 34 as viewed in FIGS. 2D & 2E, and with the disc 20 received in a slit scrubber portion 31S at the rotational location A, it may be understood from FIG. 2A that the slit scrubber portions 31S of the rotating helical slit 31 are configured to advance axially toward the exit end 24 and to apply to the received discs 20 a net force in the direction 34D. Such a net force moves (or conveys) the received discs 20 in that direction. Such movement may be from the entrance end 22 to the exit end 24, and is simultaneous with scrubbing of the sides 26 of the discs 20.

With the configuration of the slit 31 (including the axially-movable slit scrubber portions 31S described above), the slit 31 may be referred to generally as an axially-moving slit 31. Each slit scrubber portion 31S of the slit 31 moves one pitch length PL during every one 360 degree rotation of the spiral brush 30-1 around the axis 34. With the slit 31 defining the opposed scrubber surfaces 36, each of the slit scrubber portions 31S defines a portion of the opposed scrubber surfaces 36 of the brush 30-1. The portion is within angle AAA in FIG. 2E. With the slit scrubber portion 31S identified as the area of the scrubber surfaces 36 that contacts the received disc 20, an area 54 is identified to indicate the area of the disc that is contacted by the slit scrubber portion 31S. Because of the rotations of the disc 20 and the spiral brush 30-1, the respective areas 54 of the disc and portions 31S of the slit 31 in mutual contact with each other are constantly changing, i.e., moving into overlap and out of overlap. The slit scrubber portions 31S in such contact also move axially in the direction 34D at a rate referred to as AM (FIG. 2).

FIG. 2D shows that the spiral brush 30-1 and slit 31 may be described with respect to many exemplary discs 20 received in the slit 31. As indicated, the slit scrubber portions 31S are at spaced locations L between the slit entrance portion 31N (at the entrance end 22) and slit exit portion 31X (at the exit end 24) and are generally at the rotational location A. The spaced locations L are spaced by the pitch length PL. FIG. 2D shows many of these portions 31S aligned with a respective location L. With the brush 30-1 rotating, and with the described configuration of the slit entrance portion 31N, on every counterclockwise rotation of the brush 30-1 (as viewed in FIG. 2D) the slit entrance portion 31N is oriented at the location A. As the brush rotates counterclockwise from location A, in one embodiment the oriented slit entrance portion 31N may receive a new disc 20. On further rotation of the spiral brush 30-1, the received disc is received in the next slit scrubber portion 31S that becomes oriented at (rotates to) the location A (FIG. 2E) near the entrance end 22. These new discs 20 are referred to as first disc 20-1, next disc 20-2, etc., but for clarity of illustration are shown only as disc 20. Exemplary slit scrubber portions 31S are shown in FIG. 2D. One of those portions 31S is a first oriented slit scrubber portion (referred to but not identified in FIG. 2D as portion 31S-1). The first slit scrubber portion 31S-1 moves axially in the direction 34D with the newly received exemplary first disc 20-1. Simultaneously with such axial movement, there is continued counterclockwise rotation of the brush 30-1 (as viewed in FIG. 2D), and the slit entrance portion 31N is again oriented at location A. Portion 31N may again receive a new disc 20 (e.g., 20-2). On further rotation of the spiral brush 30-1, this next received disc 20-2 is received in the next slit scrubber portion 31S that rotates to location A adjacent to the entrance end 22. With these configurations of the slit portions 31N and 31S, for example, in one embodiment, one-by-one all of the slit scrubber portions 31S-1, 31S-2, etc. may become filled with (i.e., receive) a respective one of the discs 20-1, 20-2, etc. to be cleaned. In another embodiment, selected ones of the slit scrubber portions 31S-1, 31S-3, etc. may receive a respective one of the discs 20-1, 20-2, etc., and in this manner, e.g., every other slit scrubber portion 31S may receive a disc.

At the exit end 24, the reverse process may occur. With the configuration of the slit exit portion 31X, one-by-one the clean discs 20 may be removed from the slit scrubber portions 31S. Based on this description, it may be understood that all such discs 20 as have been described as being received in the slit scrubber portions 31S are actually received in the same continuous helical slit 31 that extends helically from the entrance 22 to the exit 24.

FIG. 2B also shows the spiral brush 30-1 configured to define adjacent helical turns 39 around the axis 34. Each turn 39 extends about 360 degrees around the axis 34, and may extend around the axis 34 in a range of about 350 to 360 degrees. One exemplary 360 degree turn 39 is shown in FIG. 2B by an exemplary arrow 39T. Each turn 39 is adjacent to another turn. Adjacent turns 39 may be referred to herein as 39-1, 39-2, but are only shown in the FIGs. as 39. Each turn 39 defines a scrubbing segment 40S that is configured to extend helically around the axis 34 and to extend axially by an amount equal to the pitch length PL. The slit 31 is between adjacent scrubbing segments 40S. Embodiment 30-1 of the spiral brush is configured as shown in FIG. 2C with the slit 31 radially spaced from the shaft 37S. In this manner, once the brush is configured with the helical slit 31 cut into a cylindrical brush member, for example, the scrubbing segments 40S remain connected by bridge sections 40B that extend axially between the scrubbing sections 40S. Thus, the brush 30-1 may remain in one cylindrical piece as opposed to a spiral after the helical slits 31 are configured, while the adjacent segments 40S are separated by the spiral slit 31.

Figure 2F:
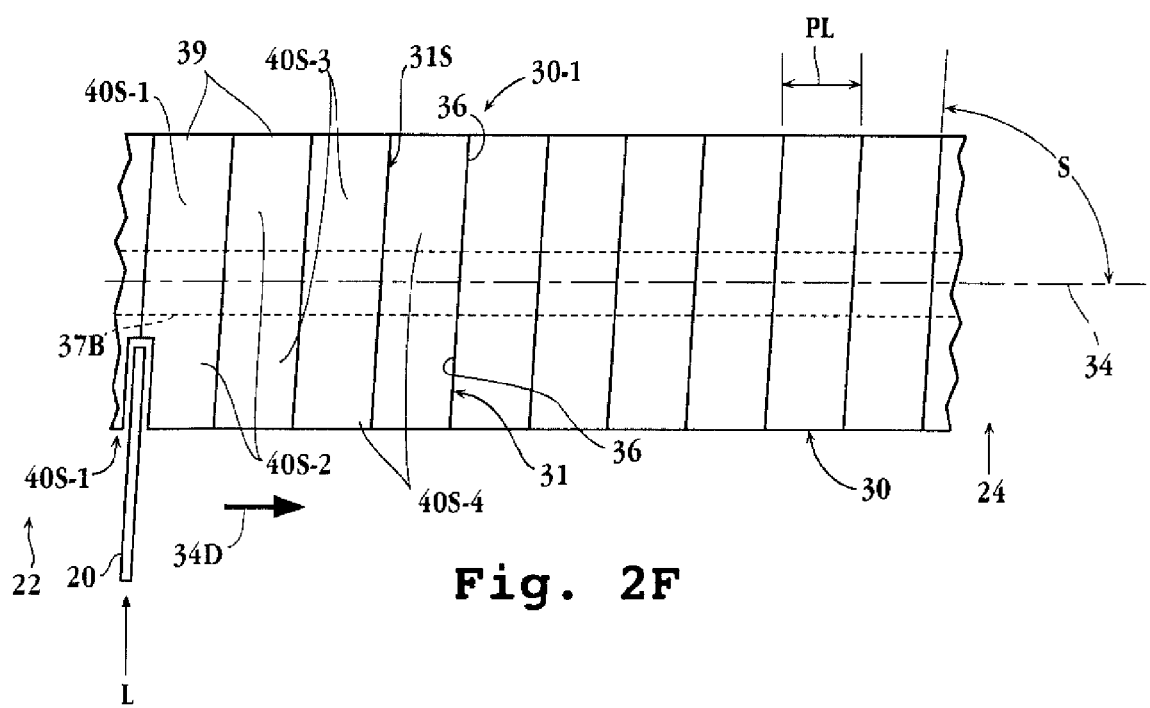
FIG. 2F is a side view of an embodiment of the spiral brush configured with different scrubbing portions of the slit to provide different scrubbing characteristics to discs conveyed by the spiral brush.

FIG. 2F shows one embodiment of the spiral brush 30-1 in which the brush is configured with the slit 31. Considering two adjacent scrubber segments 40S (i.e., a pair of segments), in the FIG. 2F embodiment, the cylindrical brush member may be configured so that different scrubbing segments 40S (e.g., shown as 40S-#) may have different scrubbing characteristics. For example, in FIG. 2F one pair may be segments 40S-1 & 40S-2. The cylindrical brush member may be configured so that the two scrubbing segments 40S-1 and 40S-2 have the same first scrubbing characteristic (referred to as SC1, not shown). Other segments may be adjacent to the pair and have the same first scrubbing characteristic SC1. Also, the cylindrical brush member may be configured so that another adjacent pair (or more) of axially-adjacent scrubbing segments (e.g., 40S-3 & 40S-4) may have the same second scrubbing characteristic (referred to as SC2, not shown), where the first and second scrubbing characteristics are different. The various exemplary sections 40S-1 through 40S-4 may, for example, be extruded as parts of an integral (one piece) brush member with axially-spaced brush material having the exemplary first and second scrubbing characteristics, and the slit 31 may be configured to define the turns 39 and the scrubbing segments 40S. It may be understood that the corresponding scrubbing segments (e.g., 40S-1, etc.) may be configured with the scrubber surfaces 36, and that such surfaces 36 may be configured with the above-described slit scrubber portions 31S that contact the received disc 20 at the areas SA.

An exemplary situation may be described: (i) the spiral brush 30-1 is at the fixed axial location, (ii) the spiral brush 30-1 and the slit 31 are rotated by the shaft 37S in a counterclockwise direction around the axis 34 as viewed in FIG. 2D, and (iii) an exemplary disc 20 is received in a slit scrubber portion 31S at the rotational location A and axial location L between scrubbing segments 40S-1 & 40S-2. Arrow 34D in FIG. 2F indicates that the slit scrubber portion 31S is configured to advance axially toward the exit end 24 and to convey the received disc 20 in the direction 34D. As a result, with the exemplary first scrubbing characteristics of the scrubbing segments 40S-1 & 40S-2 being different from those characteristics SC2 of scrubbing segments 40S-3 & 40S-4, as the received disc 20 is conveyed axially upon rotation of the spiral brush 30-1, the disc 20 may move from between segments 40S-1 & 40S-2 having the first scrubbing characteristic SC1 to between segments 40S-3 & 40S-4 having the second scrubbing characteristic SC2. In this manner the received disc may be subjected to successively different types of scrubbing. Also, in reference to the above-described slit scrubber portions 31S-1, S-2, etc. that each may receive one of the respective discs 20-1, 20-2, etc. to be cleaned, during the rotation of the spiral brush 30-1, each of those discs 20-1, 20-2, etc. may be conveyed from one or more pairs of segments 40S having the first scrubbing characteristic SC1 to one or more pairs of segments 40S having the exemplary second scrubbing characteristic SC2. Each disc 20-1, 20-2, etc. may thus be subjected to successively different types of scrubbing to which all of the other discs 20-1, 20-2, etc. have been subjected. It is to be understood that the segments 40S are exemplary, and that the respective scrubbing characteristics SC1 & SC2 are exemplary, thus the spiral brush 30-1 may be configured with many adjacent segments 40S, and those segments may have other selected scrubbing characteristics (e.g., different characteristics, e.g., SC1, SC2, SC3, etc., or the same characteristic, not shown).

FIG. 2C also shows one embodiment of the spiral brush 30-1 configured to extend radially relative to both the bore 37B and the axis 34. With the helical slit 31 extending along the helical path radially into the brush member, the brush 30-1 defines a radially-extending helical area of the helical scrubber surfaces 36. The helical area extends to an outer perimeter 410 of the brush 30-1 and is perpendicular to the axis 34. FIG. 2C also shows one embodiment of the shaft 37S received in the bore 37B. One of the helical scrubber surfaces 36 of the brush member is shown further configured with a groove 37G. A similar groove 37G may be provided on the opposite side of the helical slit 31 in the respective surface 36. These grooves 37G may extend radially away from the shaft to the area SA of contact between the disc and the slit scrubber portion 31S. The shaft 37S is shown further configured as a hollow tube with an aperture 37H aligned with the groove 37G. A similar aperture 37H may be provided corresponding to each groove 37G. The hollow shaft 37S, the aperture 37H and the groove 37G are configured to supply a fluid to the area SA and to pores within the scrubbing segments 40S to facilitate fluid flow onto the contacted sides 26 of the disc 20. The fluid flow and contact area SA result in washing to clean the contacted sides 26 of the disc.

Referring to FIG. 2B and FIGS. 3E, 5C, & 6A, it may be understood that adjacent scrubbing segments 40S on either side of the spiral slit 31 correspond to the above-referenced adjacent brush segments 32. As described, the segments 40S are part of one continuous cylindrical member that extends around the axis 34 from the entrance 22 to the exit 24 and defines one embodiment of the spiral brush 30-1. That one continuous cylindrical member is configured with the continuous helical slit 31 that defines the turns 39. The following description indicates that the segments 32 are configured to cooperate and to also define one continuous cylindrical member configured with a spiral slit that extends around the axis 34 from the entrance 22 to the exit 24 so that the segments 32 define embodiment 30-2 of the spiral brush 30.

Figure 3A:
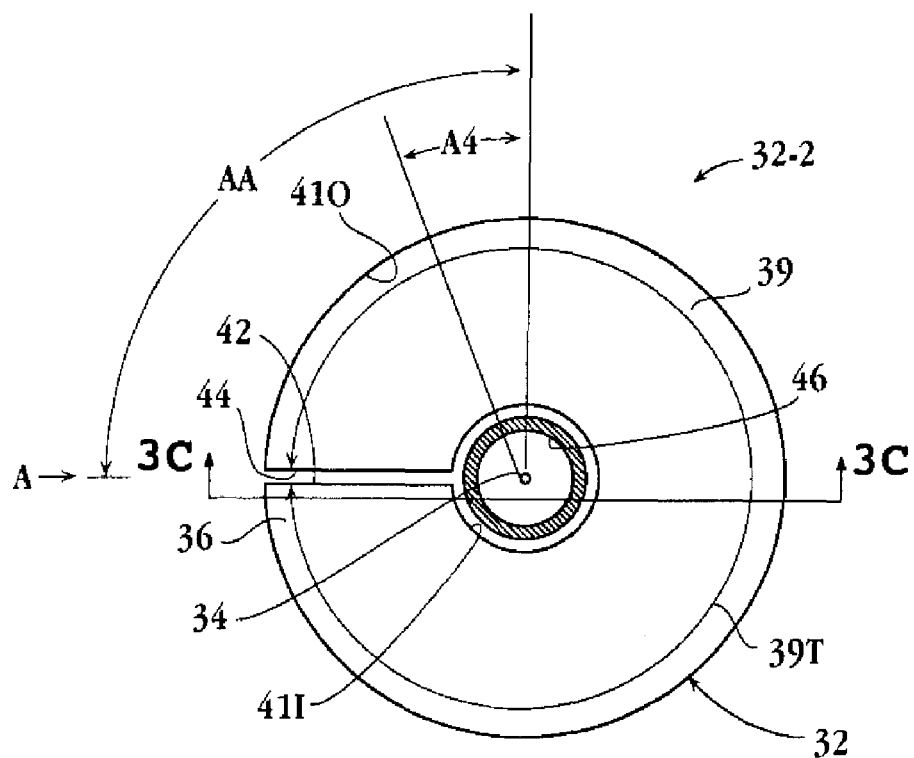
FIG. 3A is an end view of one brush segment of one embodiment of the present invention, showing one turn of a helical shape of the one brush segment.
Figure 3C:
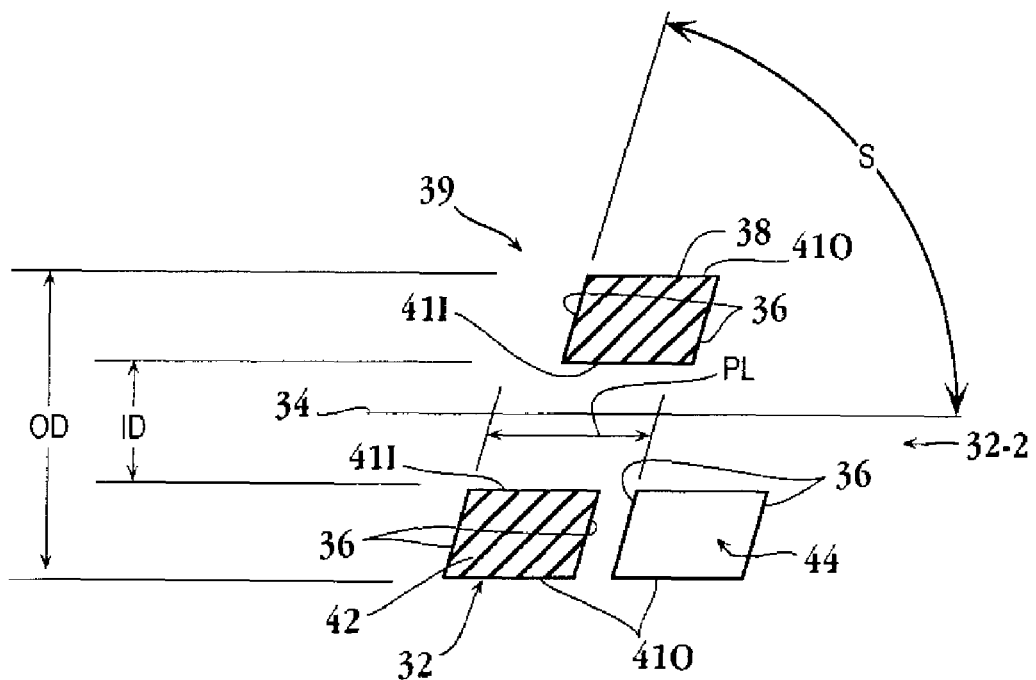
FIG. 3C is a cross sectional view taken on line 3C-3C in FIG. 3A, showing portions of the one turn of the one helical brush segment.
Figure 3B:
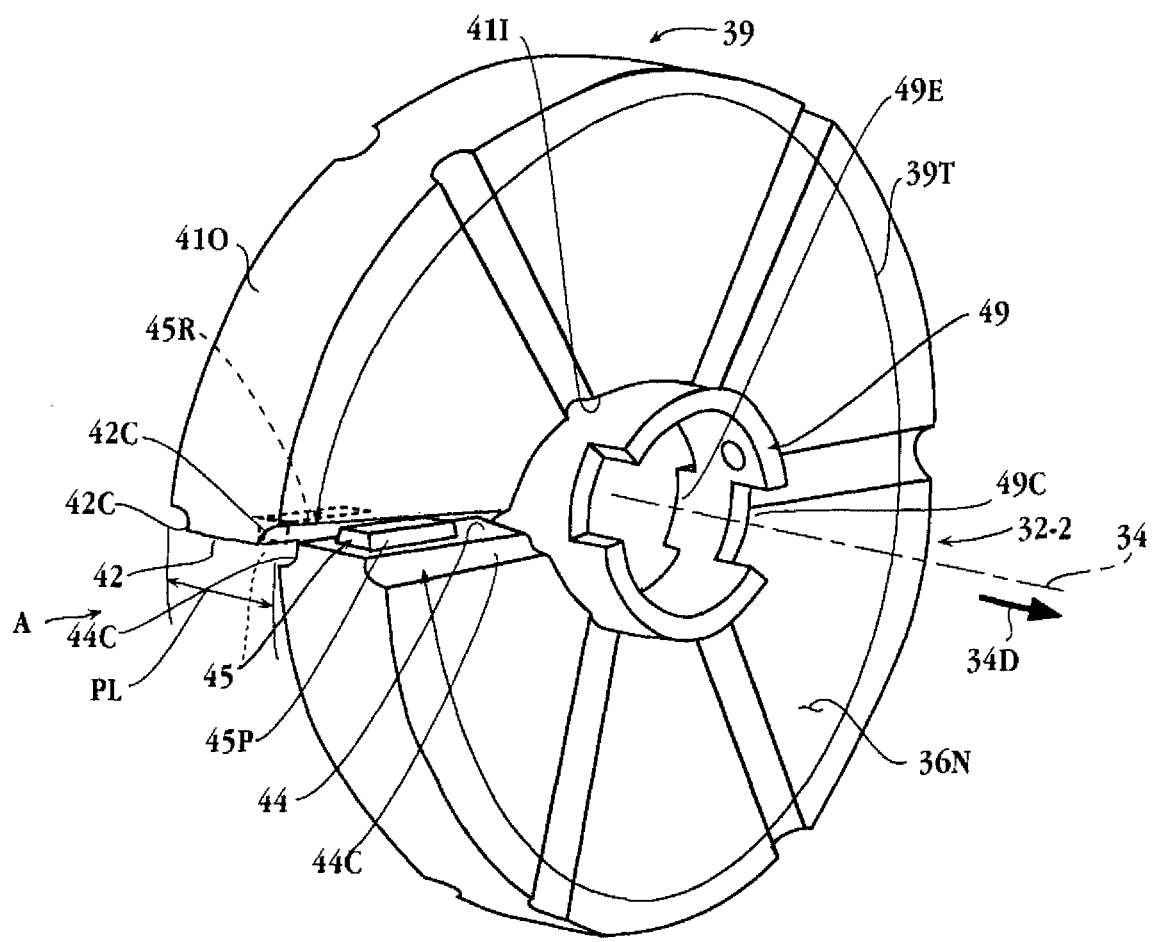
FIG. 3B is a perspective view of the one brush segment shown in FIG. 3A, showing the helical shape and a hub.

FIGS. 3D and 3E and 4A-4B illustrate one embodiment 30-2 of the spiral brush 30. FIGS. 3A-3C illustrate one embodiment of the brush segment 32, referred to as 32-2. As described below, individual brush segments 32-2 may be fabricated separately and assembled in abutting relation to define the spiral brush 30-2 effectively as a continuous brush between the entrance end 22 and the exit end 24 (FIG. 2A). FIGS. 3A & 3B show one turn (see arrows 39T) of one separate brush segment 32-2 extending once around the brush axis 34. Radially opposite surfaces are identified as a helical outer surface 410 and a helical inner surface 411. The inner surface 411 and outer surface 410 are co-axial around the brush axis 34. To effect scrubbing and conveying of a mounted and received disc 20, each brush segment 32-2 is configured with a helical shape (i.e., the spiral turn 39). Helical scrubber (or brushing) surfaces 36 (FIGS. 3A-3C) extend radially.

In one embodiment, the cooperation of the brush segments 32-2 is by way of the scrubber surface 36 of one segment 32-2 configured to cooperate with an opposed scrubber surface 36 of an adjacent segment 32-2. According to the rotary position of the spiral brush 30-2 around the axis 34, the one scrubber surface 36 cooperates with an opposed scrubber surface 36 of an adjacent segment to hold the inserted disc 20 in the generally vertical orientation shown in FIG. 3E. The configuration of the adjacent helical brush segments 32-2 may be understood by reference to FIG. 3B, in which one brush segment 32-2 is in the same orientation around the axis 34 as the orientation shown in FIG. 3A. FIGS. 3A and 3B show opposite respective first and second ends 42 and 44 of the one turn 39 of each brush segment 32-2. Each brush segment 32-2 is shown extending outward clockwise helically around the brush axis 34 from the first end 42 to the second end 44. FIG. 3C is a cross sectional view of the one turn 39 of one brush segment 32-2. The view shows the ends 42 and 44 extending radially on one side of the brush axis 34 from outer surface 410 to inner surface 411. Because of the helical configuration of the one turn 39, the second end 44 is shown axially offset from the first end 42. The offset is shown as being axially to the right in FIG. 3C, and toward the viewer as viewed in FIG. 3B. The amount of the offset is proportional to the pitch length PL (FIGS. 3B and 3C) of the helical brush segment 32-2. The pitch length PL is the length in the axial direction 34D of the one turn 39 of the helical brush segment 32-2 around the brush axis 34. In FIG. 3C a portion of the one turn 39 is shown in cross section on the other side of the axis 34 from the ends 42 and 44. FIG. 3C shows the ends 42 and 44 and the portion of the brush segment 32 each configured with a trapezoidal cross section.

Figure 3D:
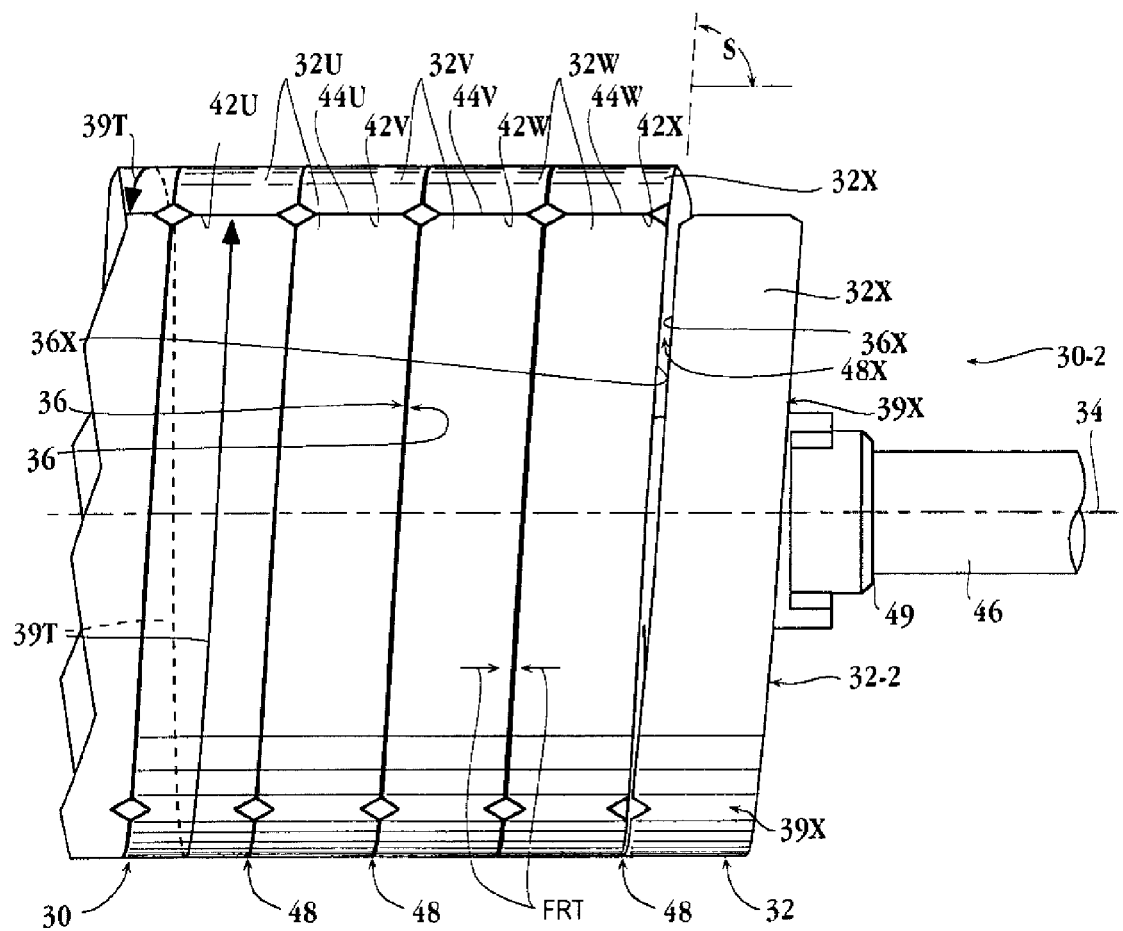
FIG. 3D is a side view of assembled brush segments of a spiral brush of one embodiment of the present invention, showing a junction between adjacent faces of the brush segments in which to receive a workpiece to be cleaned and conveyed.

FIG. 3D is a side view of one embodiment of the spiral brush 30-2 showing that to effect cleaning and conveying of the disc 20, the brush segments 32-2 of the spiral brush 30-2 are oriented next to (or adjacent to) each other. Three exemplary segments 32U, 32V and 32W are identified, including a middle (or second) segment 32V shown between segments 32U and 32W. The exemplary middle brush segment 32V is also configured with the first end 42 (shown as 42V). End 42V is at one end of the turn 39 of the middle brush segment 32V similar to end 42 of turn 39 in FIG. 3B. At the other end of the turn 39 of the second segment 32V, the segment 32V is also configured with the second end 44, shown as 44V. Ends 42 and 44 are similar for the first segment 32U (shown as 42U and 44U), and ends 42 and 44 are similar for the third segment 32W (shown as 42W and 44W).

The segments 32U & 32V, and segments 32V & 32W, are adjacent in two respects. One aspect of the adjacency is abutting adjacency (i.e., rotary abutting). For example, FIG. 3D shows that with the exemplary brush segments 32U and 32V configured in the helical shape, the end 44U of the first segment 32U abuts the end 42V of the middle segment 32V in the helical direction (i.e., rotary direction of the helix around the axis 34). The end 44V of the middle segment 32V abuts the end 42W of the third segment 32W. In this manner, one helical segment 32 (e.g., 32V) is effectively a continuation of a prior helical segment 32 (e.g., 32U). Also, segment 32V is effectively continuous with the later segment 32W. In this exemplary manner, the brushes 30-1 and 30-2 are configured with similar continuous helical brush structures.

The other aspect of the adjacency is the segment 32 being next to each other axially. For this aspect, FIG. 3A shows that the helical inner surface 41I is supported by a drive shaft, or hollow tube, 46 (similar to the shaft 37S). In this aspect, the segments 32U, 32V & 32W are mounted axially next to each other, in an axial series on the tube 46. This may also be described as axially abutting. The shaft 46 may be mounted at an angle (or tilted) relative to horizontal as shown in FIG. 2A, so that the entrance end 22 is lower than the exit end 24. In one embodiment, the amount of tilt may be about the same as the angle S of the pitch of the segments 32-2, so that the discs to be inserted into the spiral brush 30-2 may be inserted vertically. Also, in this manner fluids from the cleaning of the dirtiest discs (starting at the entrance 22) will not flow to cleaner discs that are uphill of the entrance 22 (i.e., toward the exit 24). A cascade cleaning effect may thus be provided. In another embodiment, the tube 46 may be level and the discs inserted tipped somewhat relative to vertical.

The configuration of the spiral brush 30-2 for the rotary abutting and axial abutting also relates to mounting of the spiral brush 30 for rotation around the brush axis 34 while held against movement in the direction 34D of the axis 34. FIG. 3B shows each brush segment 32-2 configured with a hub 49 configured to facilitate the axial abutting adjacency of multiple brush segments 32-2. In one embodiment, the hub is configured with a slot coupler 49C that connects to the tab coupler 49E of an adjacent hub 49 of segment 32-2. The brush segments 32 are supported by and secured to the respective hubs 49, and the hubs 49 are configured hollow to receive the tube 46. FIG. 2A shows that this mounting and holding may be facilitated by connecting the tube 46 to a drive motor 50 that is secured to a fixed mount plate 51.

In one embodiment, the rotary abutting adjacency of the brush segments 32 next to each other is facilitated as shown in FIG. 3B. There, an interlock 45 is shown configured on each of the ends 42 and 44. On the end 44 the interlock may be a projection 45P and on the end 42 the interlock may be a recess 45R. With respect to the segment 32-2 shown in FIG. 3B, another segment 32-2 may be placed adjacent (as shown, e.g., in FIG. 3D) and the interlock 45 interlocked with the projection 45P inserted into the recess 45R. The projection 45P and the recess 45R are configured to provide a tight fit between the two. Thus, when interlocked, the two ends 42 and 44 remain together and the spiral path of the turn from one segment 32-2 to the next adjacent segment 32-2 is maintained. In this manner the segments 32-2 are configured to cooperate and define one continuous cylindrical member that extends around the axis 34 from the entrance 22 to the exit 24 so that the segments 32-2 define the embodiment 30-2 of the spiral brush 30.

FIG. 3D shows the exemplary brush segments 32U, 32V, & 32W configured having the helical shape and so mounted in series on the shaft 46. The opposed scrubber surfaces 36 of the exemplary three adjacent brush segments 32U, 32V, & 32W are shown defining the embodiment of the slit 31 that is referred to above as the helical junction 48. The junction 48 is where segments 32U and 32V, e.g., are axially adjacent. In the manner of the slit 31, the junction 48 extends in the helical path around the axis 34. The junction 48 is described first with respect to these three exemplary segments 32U, 32V, & 32W that may be referred to as an exemplary junction 48. The junction 48 is located where the adjacent surfaces 36 (of the adjacent brush segments 32-2 of the junction unit 48) come together into the axially adjacent relation. The junction 48 defines a "tilted" (or skewed), axially-movable, force slit, or slit, embodiment of the slit 31. The tilt (or skewing) is defined by a value of the angle S between each of the adjacent surfaces 36 and the brush axis 34. The value of the angle S may be the same as that described with respect to FIG. 2B. In one embodiment, the junction 48 is "normally-closed," which means that these opposed adjacent surfaces 36 of the junction unit 48U touch each other when no disc 20 is received in the junction 48. The touching embodiment is shown in FIG. 3D. In another embodiment, "normally-closed" means that these adjacent surfaces 36 of the junction 48 are separated by a space having a small value, such as less than the thickness T of the disc 20, which thickness may be, e.g., about 1.75 mm to about 0.635 mm. In yet another embodiment, "normally-closed" may mean that these adjacent surfaces 36 of the junction 48 are separated by a space about equal to the thickness T of the disc 20. In yet another embodiment, "normally-closed" may mean that these adjacent surfaces 36 of the junction unit 48 are overlapping, such that the surfaces 36 are slightly compressed against each other. In yet another embodiment, "normally-closed" may mean that these adjacent surfaces 36 of the junction unit 48 are configured with a feature (such as interlocking protrusions and depressions) such that overlapping can occur without compressing each other, with such feature being effective for scrubbing the opposite sides of the workpiece received between the opposed helical scrubber surfaces. In each such embodiment, the junction 48 defined by the adjacent segments 32 is effectively a continuous junction, and thus the spiral brushes 30-1 and 30-2 are configured with similar continuous helical junction structures 31 and 48, respectively.

In each such "normally-closed" embodiment, the exemplary adjacent segments 32U, 32V, and 32W of the junction 48 are configured from a material (described below) that has a characteristic of resiliency, enabling the scrubber surfaces 36 to comply with or conform to the contour of the disc surfaces 26. With this resilient characteristic each scrubber surface 36 of the junction 48 may apply forces axially when the opposed surfaces 36 touch each other (FIG. 3D). When a disc 20 is received in the junction 48 (FIG. 4B), the forces are identified as forces FRT. In other words, the "normally closed" embodiments may be described in terms of the brush segments 32-2 being configured so the scrubber surfaces 36 oppose each other, and in certain of the embodiments, tend to overlap. The tendency to overlap is resisted when the scrubber surfaces 36 touch at the junction 48, and the characteristic of resiliency of the material causes the opposing forces as the scrubber surfaces 36 continue to try to overlap each other, but instead axially abut and are forced against each other. In each such embodiment, when the disc 20 is received in the junction 48 (FIG. 4B), the forces FRT of the scrubber surfaces 36 are applied to opposing sides 26 to scrub those sides 26.

Figure 4A:
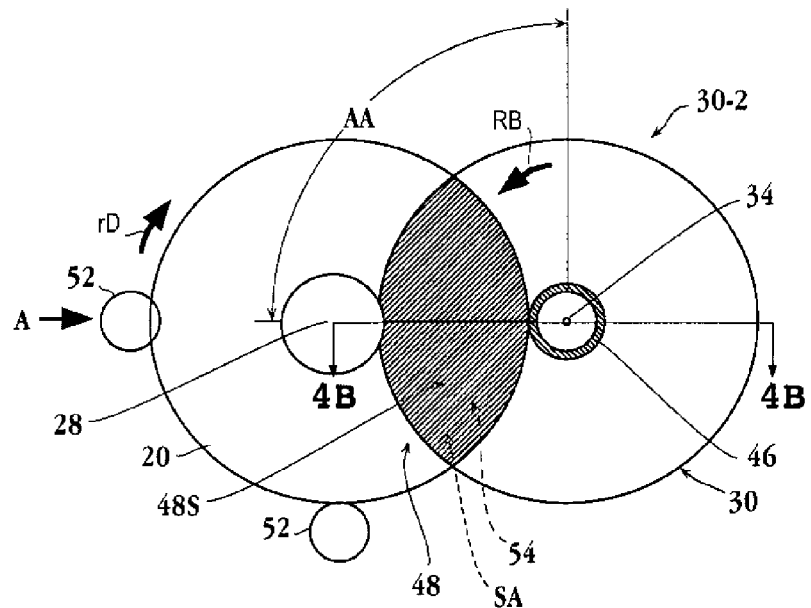
FIG. 4A is an end view of one embodiment of the spiral brush of the present invention, showing the workpiece as a disc inserted in a junction defined within the brush, and illustrating an overlap area of the brush and with the workpiece at which the scrubbing may occur.

The description of FIG. 2E also applies to the junction 48. In FIG. 2E the area SA of scrubbing contact is between an area 54 of the received disc 20 and the slit scrubber portions 31S of the opposed scrubber surfaces 36 of the brush 30-1. The slit scrubber portions 31S are the areas of the scrubber surfaces 36 that are in contact with the areas 54 of the received disc 20. For the junction 48, FIG. 4A shows the same area SA of scrubbing contact, and that contact is with a junction scrubber portion 48S of the junction 48. FIG. 4A also identifies a similar area 54 to indicate the area of the disc that is contacted by the junction scrubber portion 48S.

Figure 3E:
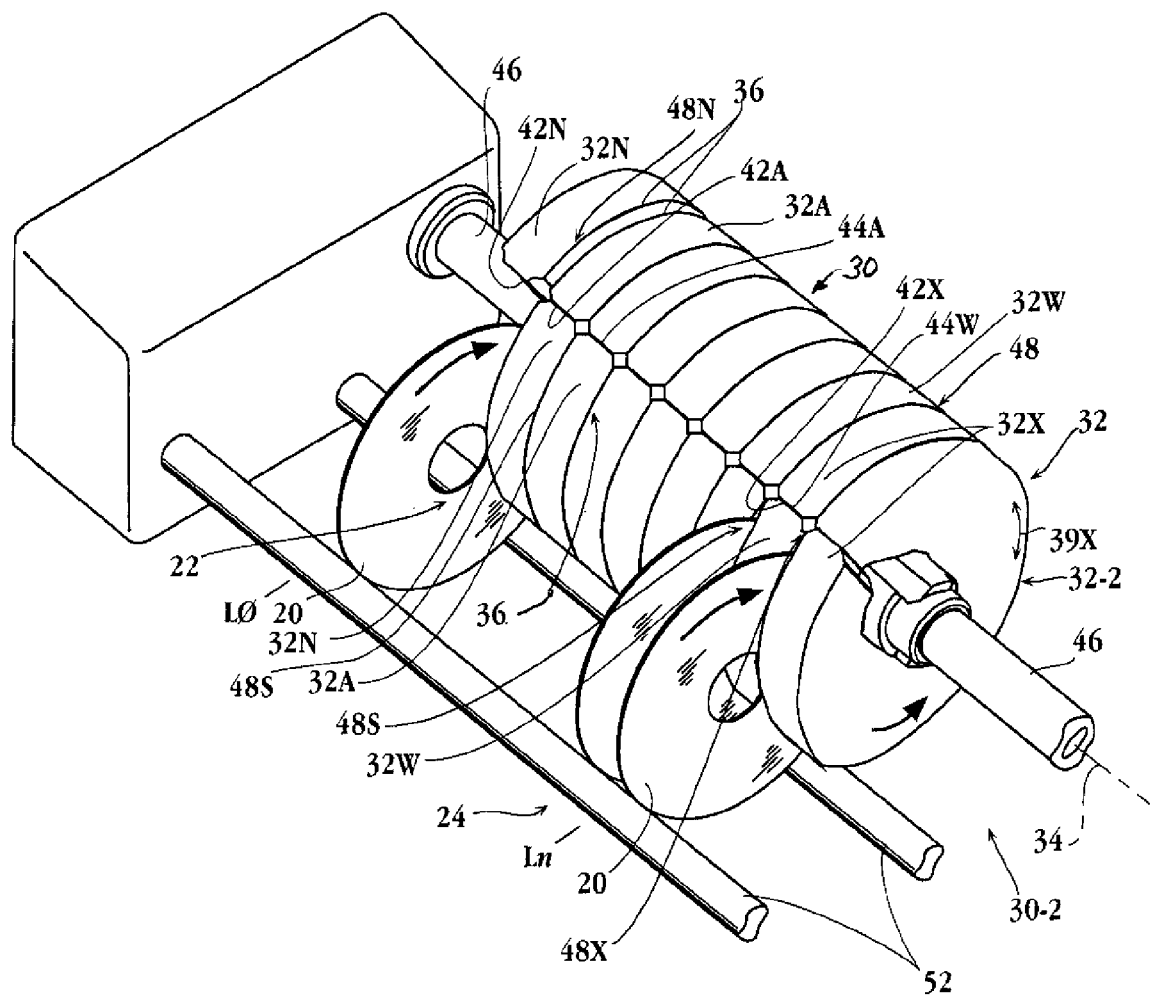
FIG. 3E is a perspective view of the spiral brush shown in FIG. 3D, illustrating entrance and exit junctions, showing removal of the workpieces from the exit junction in accordance with one embodiment of the invention.

FIG. 3E also shows the configuration of the ends of the spiral brush 30-2. The ends are adjacent to the respective entrance 22 and exit 24. Brush segment 32N is at the entrance end 22. A junction entrance 48N of brush segment 32N is shown at the left, and is described with respect to a next brush segment 32A. FIG. 3E shows one embodiment in which the entrance brush segment 32N is configured so that the helical slit (in the form of the junction 48) defines the junction entrance 48N to be wider than the thickness T. The entrance 48N is also tapered so that on counterclockwise rotation of the brush 30-2 the entrance 48N guides the disc into the helical junction 48, facilitating reception of the disc 20 into the helical junction scrubber portions 48S. To provide the junction entrance 48N of entrance brush segment 32N wider, the corresponding brush surface 36 of brush segment 32N is configured at an angle of ninety degrees relative to the axis 34 (e.g., as viewed in FIG. 3D), and is thus not skewed relative to the axis 34. In this manner, the one turn 39 of the entrance brush segment 32N at the entrance end 22 is tilted counterclockwise (as viewed in FIG. 3E) away from the opposed scrubber surface 36 of the next brush segment 32A. As a result, in this embodiment the first end 42N of the entrance brush segment 32N is configured axially spaced from the first end 42A of the next brush segment 32A by an amount that is more than the pitch length PL, so that the entrance junction 48N is thus defined in this embodiment. The entrance junction 48N is thus tapered and initially has an axial dimension that is greater than the thickness T of the disc 20. The junction entrance 48N thus may easily receive a disc 20 as the brush 30-2 rotates counterclockwise in FIG. 3E, and guides that disc into the junction 48, i.e., into the junction scrubber portion 48S.

At the right end of the brush 30-2 shown in FIG. 3D, one embodiment of an exemplary last brush segment 32X is shown configured in an opposite manner as compared to first brush segment 32N. A last turn 39X is of the last brush segment 32X. FIG. 3D shows the last turn 39X starting between end 42X and end 44W and skewed a few degrees clockwise from the angle S, so that the exit junction 48X is defined. The exit junction 48X is thus tapered to define a normally-open configuration in which the scrubbing surfaces 36X of the junction exit 48X are axially offset by more than the thickness T. This offset facilitates easy removal of disc 20 from the junction 48 as the brush 30-2 rotates counterclockwise in FIG. 3E.

FIG. 3B also shows one embodiment in which corners are provided on the ends 42 and 44 of the brush segment 32-2. The exemplary segment 32-2 in FIG. 3B is shown with the corners of the abutting ends 42 and 44 of each brush segment 32-2 configured with a respective bevel, or chamfer 42C or 44C, to minimize catching of a disc on the respective end 42 or 44 as those brush segments 32-2 rotate with a disc received in the junction 48. One skilled in the art will appreciate that numerous configurations of a chamfer 42C or 44C, e.g., a concave shape, a convex shape, etc., may be employed to guide the disks into the junction 48 and to minimize catching of a disc on an end 42 or 44.

Figure 4B:
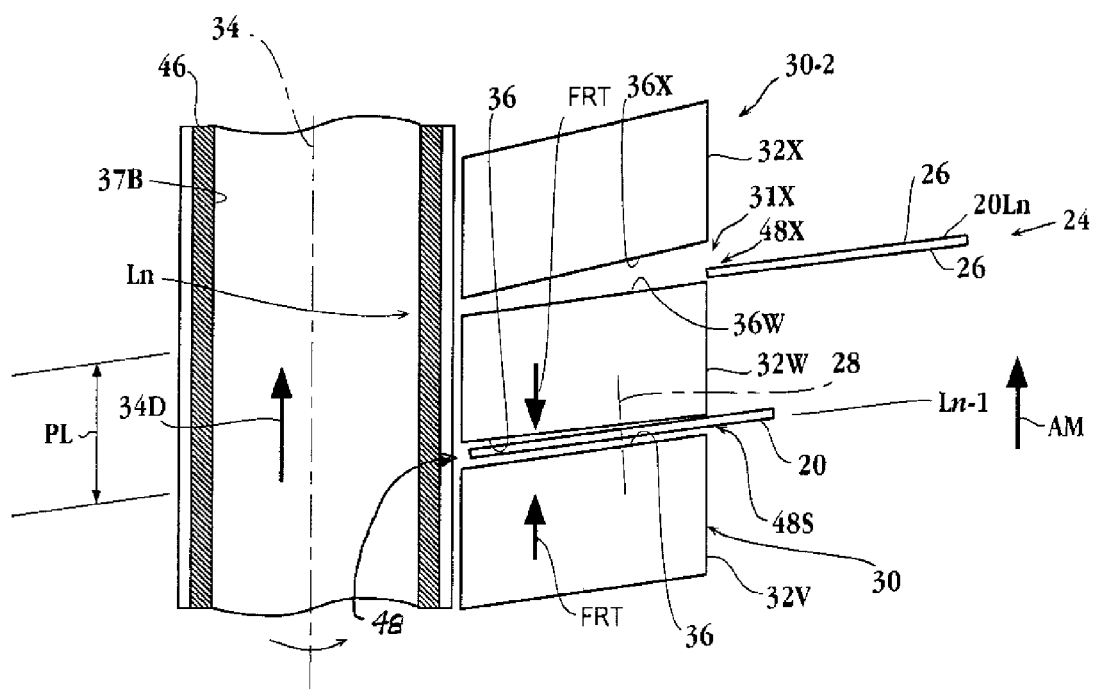
FIG. 4B is a cross-sectional view of portions of adjacent brush segments, showing the disc having been conveyed and cleaned as the junction has moved axially to a second location during a time period in accordance with embodiments of the invention.

FIG. 3D shows one rotary position of the spiral brush 30-2 different from that shown in FIG. 3B. This difference illustrates that a disc 20 may be received in the junction 48 between either two or three segments 32-2 according to the rotary position of the spiral brush 30-2. The rotary position of the spiral brush 30-2 may be understood from FIG. 4A, that is similar to FIG. 2E. FIG. 4A shows a disc 20 received in the junction 48 of the brush 30-2. Corresponding to the above-described slit scrubber portions 31S of FIG. 2E, FIG. 4A shows that the received disc is in the junction scrubber portion 48S that is identified with respect to (1) a rotational location A around the axis 34 (as defined by an angle AA); and (2) a location parallel to (or along) the brush axis 34 (e.g., see disc 20 at location Ln-1 in FIG. 4B). FIG. 4B is a cross sectional plan view (rotated 180 degrees from FIG. 4A) showing the disc 20 received in the junction scrubber portion 48S. Portion 48S is shown defined by brush segments 32V and 32W. Exit segment 32X is shown axially of segment 32W. FIG. 4B is further described with respect to the tube 46 and the brush 30-2 that are fixed in the axial direction 34D. The tube rotates the brush 30-2, and the junction scrubber portion 48S in which the disc 20 is received thus moves axially (parallel to the direction 34D) toward the exit 24. The disc 20 is squeezed by the junction scrubber portion 48S on area SA (FIG. 4A). The axial location Ln-1 of the disc 20 in the junction scrubber portion 48S moves axially (parallel to the direction 34D) toward the exit 24. FIG. 4B shows an exemplary situation in which, as the brush 30-2 rotates one revolution (i.e., one turn), the junction scrubber portion 48S and the received disc 20 move from location Ln-1 to a location Ln. Location Ln is spaced from location Ln-1 by the pitch distance PL. The disc 20 at location Ln is identified by 20Ln and is located for removal from the brush 30-2. In FIG. 4B, the junction identified as "48X" at exit 24 represents the junction 48S after having moved to location Ln.

The opposed forces FRT (FIG. 4B) are applied by embodiments of the rotating spiral brush 30-2 rotating at rate RB (FIG. 4A) via the opposed scrubber surfaces 36 at junction scrubber portions 48S. Such forces rotate the disc at the rate rD (FIG. 4A). Rate rD is around the disc axis 28 and has a value less than rate RB. Also, because the junction scrubber portion 48S (positioned at angle AA) moves axially from one location Ln-1 to a next location Ln, and because disc support rods 52 may be configured, e.g., with an axially-movable carriage (not shown) to allow (or assist) the disc 20 to move axially toward the end 24, the disc in the vertical orientation (FIG. 4A) is moved axially. The disc axial movement is at the rate AM (FIG. 4B) that is proportional to the brush rotation rate RB and to the pitch length PL. Additionally, as viewed in FIG. 2E, with the brush 30-1 rotating counterclockwise, it is seen that the rods 52 are located so as to prevent the junction scrubber portion 48S from carrying the disc 20 counterclockwise around the brush axis 34 as the brush 30-1 rotates. With the configuration described above, the junction scrubber portions 48S may thus be referred to as axially-moving junction scrubber portions 48S. Because of the rotation of the disc 20, the actual areas SA of scrubbing contact (between the scrubber surfaces 36 and the disc 20) are constantly changing. Further, these contact areas SA, contact surfaces 36 and contact portions 54 (FIG. 4A), and the defined scrubber portion junction 48S), are also moving axially in the direction 34D of the brush axis 34 at the rate AM. The junction 48, by the junction scrubber portions 48S, may apply a net axial force on and move the disc 20, and that net force may be supplemented by the referenced carriage or configurations of the rods 52 for supporting a group of discs at the edges of the discs. The difference in the respective rates of rotation rD of the disc and RB of the brush segments and the contact at the area SA result in a scrubbing action of the junction scrubber portions 48S on both sides 26 of the disc. The scrubbing action cleans the disc.

The disc 20 is clean by the time the disc is axially moved to location Ln at the exit 24 (FIG. 4B).

With a selected rate of the brush rotation rate RB, and with a selected pitch length PL, there is a controllable (selectable) period of time (referred to as TCT, not shown) during which the cleaning and conveying of the disc 20 occurs during the axial movement of the disc 20 from location L0 to Ln as shown in FIG. 3E. The time period TCT may be long relative to typical time periods of batch brushing. In such batch brushing, all discs (e.g., 25-50) of a group are loaded simultaneously one next to the other, each disc being mounted and held at a separate fixed axial location. A different brush is used to brush each different disc, and all discs are brushed simultaneously during one time period (referred to as BP, not shown) in which all of the discs are rotated at that separate fixed axial location. Then the cleaning stops, and all of the discs are unloaded simultaneously.

In contrast, in view of the helical configuration of the junction 48 and of the slit 31, the following results, for example. References to the entrance 31N (FIG. 2A) apply as well to the entrance 48N (FIG. 3E) and to junction 48, and visa versa. In one embodiment, a disc inserter (not shown) may operate to perform a one-disc-by-one disc insertion into the brush 30. Thus, at the entrance 22 the inserter may periodically insert one disc at a time into the entrance 31N. Such insertion may be as frequently as once every time the entrance slit 31N is presented to (i.e., becomes axially aligned with) the location L0 (i.e., upon rotation of the brush 30-1 to align that entrance 31N with the location L0 at angle AA, FIG. 4A). The disc inserter moves the discs one at a time into the entrance 31N. Brush rotation causes the disc to enter the slit scrubber portion 31S (or the junction scrubber portion 48S of junction 48). For example, in one embodiment, the inserter may insert one disc into the brush at an insertion rate in a range of from about every 1 to about every 10 seconds. The insertion rate may be a function of the pitch length PL and the rate of brush rotation RB. Rate RB may, for example, be in a range of from about 5 to about 60 RPM. The pitch length may be in a range of about 0.25 inches to about 0.50 inches.

In further reference to FIG. 3E, a disc 20 received in the junction 48 has been described with respect to two or three segments according to the rotary position of the brush 30-2. The following description also applies to the sections 40S of FIG. 2F (shown as 40S-1 through 40S-4). Viewing FIG. 3E, it may be understood that many brush segments 32-2 may be provided to configure the brush 30-2 between the entrance 22 and the exit 24, and exemplary brush segments 32N & 32A at the left end, and 32W & 32X at the right end, are shown. The last segment 32-2 (i.e., segment 32X) may be the "n th" segment, where "n" identifies a last segment of many segments, and "n" may be in a range of from about 3 to about 100. Any number of adjacent brush segments 32-2 may be grouped, e.g., FIG. 3E shows n=8. In each case, there is a junction 48 between the respective scrubbing surfaces 36 of the respective adjacent brush segments 32-2, and each junction 48 may include the above-described axially-moving junction scrubber portion 48S with the contact area SA. As a result, by the action of the disc inserter, a selected helical junction 48 may receive a disc at location L0. At selected intervals, next junction 48 may receive a next disc. The inserted discs are axially moved and cleaned by the scrubbing action noted above during the time period TCT. Then, at location Ln, one-by-one the discs are removed from the respective helical axially-moving junction scrubber portion 48S. It may be understood that any group of the discs 20, such as all of the discs 20 that are inserted in the brush 30-2 during any one time period, are scrubbed by the same brush 30-2, such that the embodiments provide a configuration in which all discs of such a group are cleaned by the same brush 30. This subjects each disc 20 of the group to substantially the same scrubbing operation and promotes uniformity of the surfaces 26 of all of the discs of the group.

Every time the junction 48 is presented to the location L0 (or at such other intervals as may be selected), the inserter may operate to insert a disc 20 into the newly-aligned and open slit entrance 48N. Every time the slit exit 48X is presented to the location Ln with a clean disc at the angle A (FIGS. 2E & 4A), or otherwise as required, a disc extractor, or the noted carriage, may operate to remove the clean disc 30 from the newly-aligned and open slit exit 31X. The total number n of segments 32-2 may be selected in conjunction with selecting the rate RB and the pitch length PL. In this manner, the time period for cleaning and conveying the discs may be determined to be in a range of from about 1 minute to about 300 minutes. Of course, the time period for cleaning may vary depending on the configuration of the spiral scrubber and the cleaning parameters. In one embodiment, once each junction 48 at the location A (FIG. 4A) has received a disc 20, a clean disc exits the end 24 every exemplary 1 to 10 seconds, for example. In this manner, the brush 30 quickly cleans the discs 20, yet allows up to the exemplary 300 minute long duration of the cleaning process on one particular disc.

In one embodiment, the scrubbing action at the contacted areas 54 of the discs 20 (FIG. 4A) may be facilitated by fluids such as DIW, chemicals, other cleaning solutions, or surfactants, for example. These fluids may be introduced to the junctions 48 from above, or by supplying the fluid to the tube 46. In the one embodiment shown in FIG. 2C, the fluid supply may be via the apertures 37H in the tube 37S that extend radially and that are aligned to connect to the grooves 37G in the scrubbing surfaces 36 of the segments 32. This fluid supply may be as described above, in which the groove 37G was said to be configured in the scrubber surface 36 to supply fluid to the contact area SA and to pores within the scrubbing segments 40S, to facilitate fluid flow onto the contacted sides 26 of the disc 20 and resulting in cleaning of the contacted sides 26. Other fluid supply may be configured as described in connection with the embodiments described below in reference to FIGS. 6A-6H.

Another embodiment may be understood by reference to FIG. 3E. Discs 20 inserted into the brush 30-2 at the entrance 22 may be said to be previously uncleaned, and the disc may be coated with (or covered with or carry), for example, particles that may be best removed from the disc by a particular configuration (referred to as C#, e.g., C1, not shown) of the brush 30-2, or of a portion of the brush. Such portion of the brush 30-2 may be defined by any number N (not shown) of adjacent brush segments 32, for example. The brush 30-2 with a configuration C1 may be referred to as a first type of brush. With respect to a number N of adjacent brush segments 32, this configuration C1 may be referred to as a first type of brush. For ease of description, references to "type of brush" (or "types of brush") also refer to a type of all brush segments 32 in the number N of adjacent brush segments having the same configuration C. Also, for a second type of brush the configuration may be identified as C2, etc. Different types of brush segments may be "n" types, and each type of brush may be differently configured so as to best remove a next type of particle or surface condition from the disc after first removal of underlying layers or particles or materials using the first type of brush configuration C1, for example. In each case of the configurations C, the type of brush may be based on a selection of brush characteristics for the N brush segments. Exemplary characteristics may include a particular type of material from which the brush segments 32 are made (e.g., a material with a particular resilience characteristic, or a density of any such material, e.g., for application of different forces FRT); or a brush thickness in the axial direction 34D, or a configuration of the scrubber surfaces 36 with channels or porosities for ideal application of fluid through the brush segments to the disc, or a selected topography of the sides 36 of the segments, or combinations of any of these individual configurations or characteristics. The brush materials may be PVA, polyurethane, nylon, or other suitable materials. Also, the brush materials may be composed of a material having an ability to be impregnated with an abrasive material, for example. Such abrasive materials may include powdered metal and diamond dust, for example. Selections of brush materials and the other characteristics described above may be made so as to have appropriate forces FRT or time of scrubbing, etc. as may produce the best scrubbing for the particular type of discs to be scrubbed by a particular spiral brush 30.

With this in mind, and in exemplary reference to the brush segments 32-2 shown in FIGS. 3A-3E, the first type of brush may be provided for a first number N of brush segments (e.g., N=4, not shown) as may be suitable for best removal of a first type of particle or surface condition from the disc. A next second type of brush may be provided for a next number N of brush segments (e.g., N=6, not shown) as may be suitable for best removal of a next type of particle or surface condition from the disc. Similarly, a next third type of brush may be provided for a next number N of brush segments (e.g., N=8, not shown) as may be suitable for best removal of a still next type of particle or surface condition from the disc. This configuration of the brush 30 with a series of the next type of brush (i.e., brush segment 32) may be repeated as necessary. In the use of a brush 30 with that configuration of next types of brush (i.e., brush segments 32), each number N of such brush segments acts on each disc. As a particular junction scrubber portion 48S and the disc in that particular junction scrubber portion 48S move through such number N of brush segments having the exemplary characteristic C1. Then the junction scrubber portion 48S moves through the next number N of brush segments having the exemplary characteristic C2. It may be understood then that by providing different brush configurations C in which there may be axially different scrubbing characteristics (e.g., C1, C2, etc.) of one brush 30 that is used to scrub a group of discs, not only may all of those discs be scrubbed by the same brush, but the scrubbing may be tailored for the initial and underlying conditions of the discs in the particular group of incoming discs. In addition, as described below with respect to FIGS. 6A-6H, the delivery of the cleaning fluid to the disc during scrubbing may be tailored. That is, along with the different configurations C of axially adjacent segments 32 of the different types of brushes as described above, the cleaning may be further tailored to apply different cleaning fluid to the different ones of the numbers N of segments.

Figure 5A:
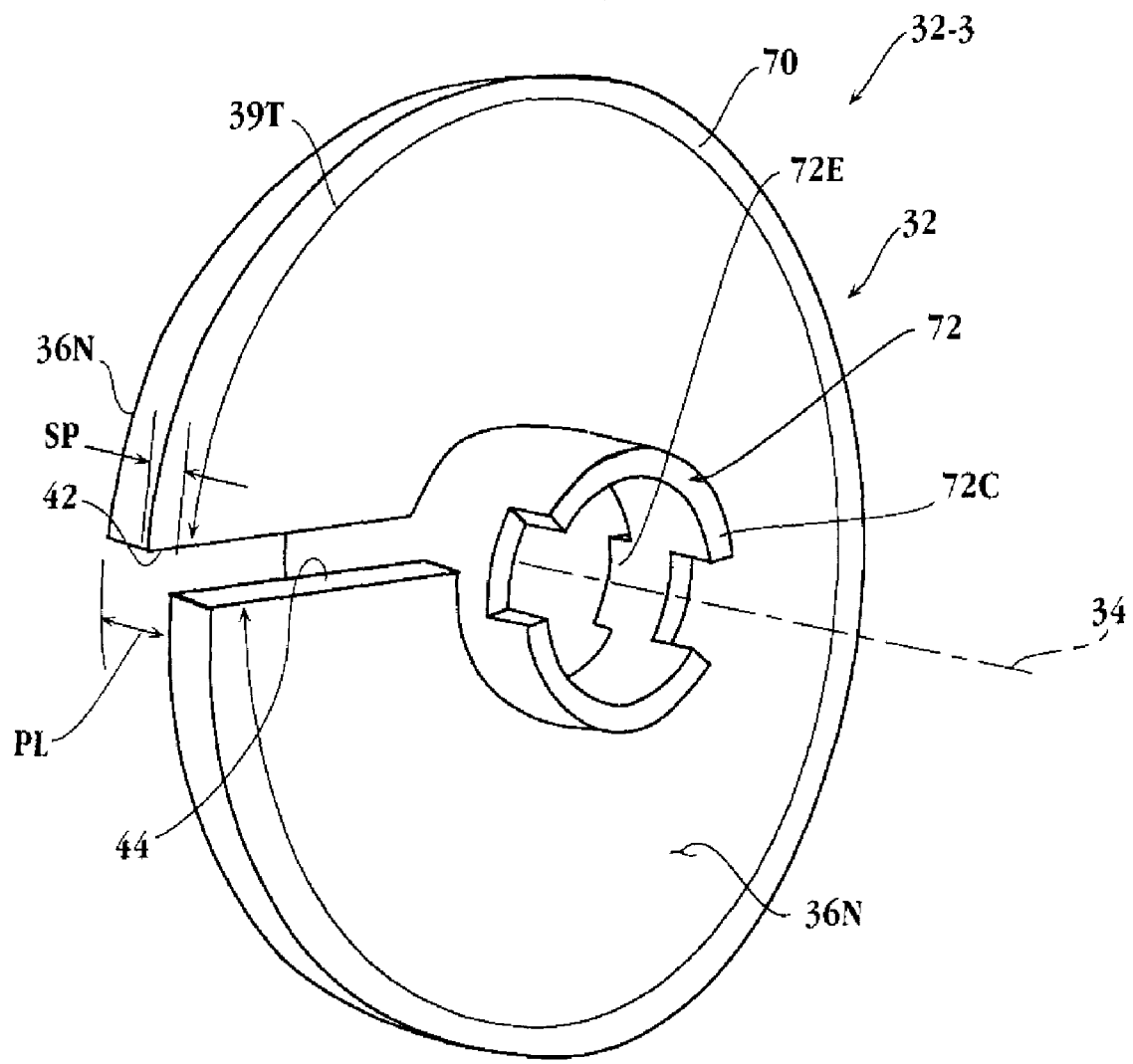
FIG. 5A is a perspective view illustrating a vane (or backbone) for supporting a brush member in accordance with one embodiment of the present invention.
Figure 5B:
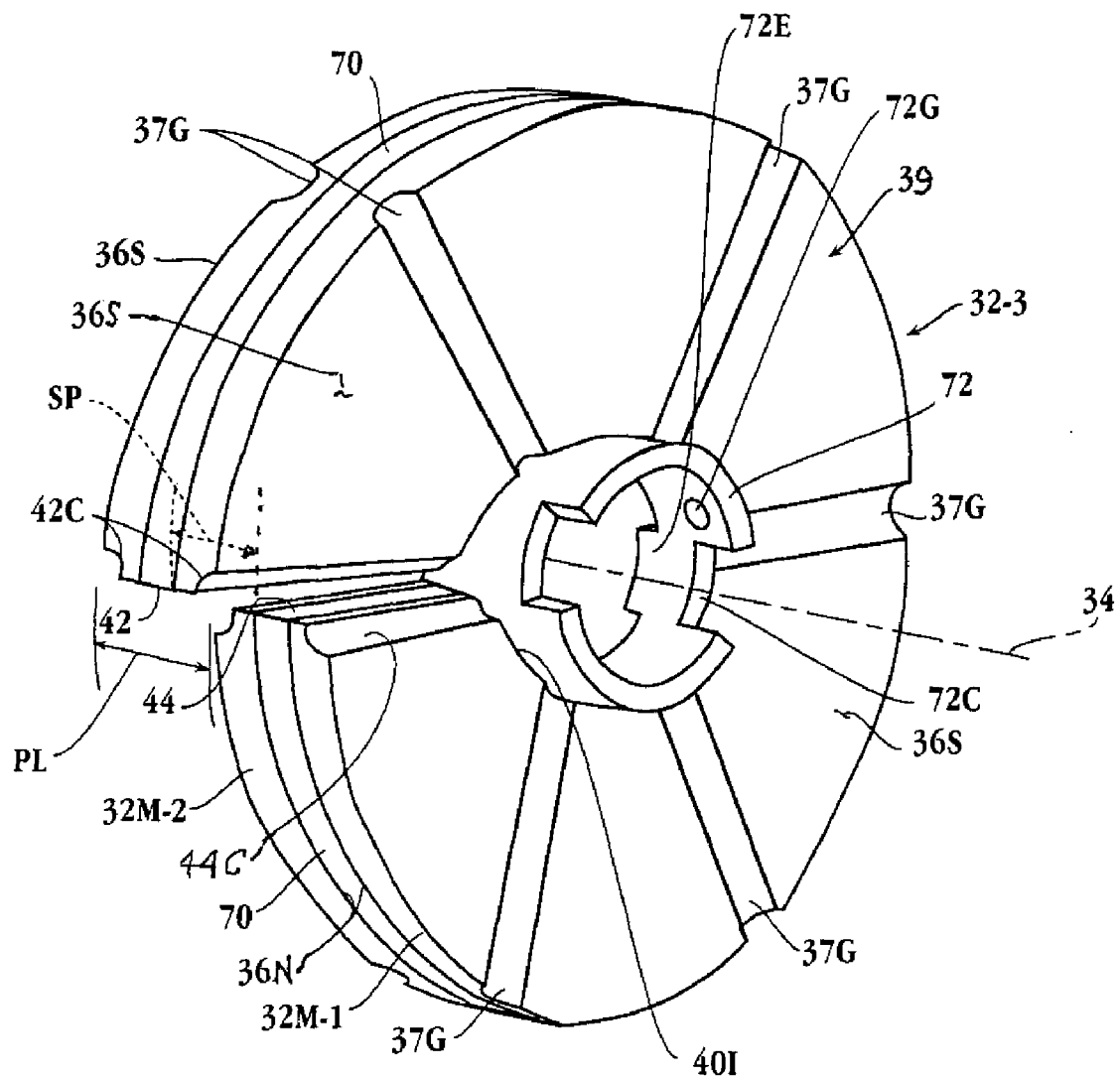
FIG. 5B is a perspective view illustrating a brush segment, showing the vane between brush members in accordance with one embodiment of the present invention.

FIGS. 5A and 5B illustrate aspects of one embodiment. FIG. 5A shows a spiral vane 70 for supporting another embodiment of the brush segment (referred to as 32-3). FIG. 5A shows that the vane 70 of one segment 32-3 is configured to extend helically one turn 39 (arrow 39T) around the axis 34. The vane 70 is configured from a rigid material that is effective to support helical (or spiral) non-scrubbing surfaces 36N. FIG. 5B shows the surfaces 36N supporting helically shaped brush segment members 32M-1 and 32M-2 of this embodiment of the brush segment 32-3. The members 32M-1 32M-2 are configured with helical (or spiral) scrubbing surfaces 36S. The rigidity characteristic of the vane 70 is in a direction parallel to the axis 34. The vane 70 may be configured from rigid metal or plastic, or may be molded from a suitably rigid material, for example. The vane 70 is also configured with a central core (or hub) 72 having a slot coupler 72C at one end and a tab coupler 72E at the opposite axial end. The respective slot and tab couplers 72C and 72E enable axially adjacent vanes to connect and drive each other. This driving is rotation around the brush axis 34. In one embodiment, the hub 72 may be adjacent to the axis 34 and configured as an axially-short tube having one or more apertures 72G extending radially through a wall of the tube similar to the aperture 37H shown in the shaft 37S in FIG. 2C. One or more of the grooves 37G in the scrubbing surfaces 36S may be aligned with an aperture 72G to supply the above-described fluid.

Still referring to FIG. 5B, this driving also rotates the brush segment members 32M-1 and 32M-2. The brush segment members 32M-1 and 32M-2 of one brush segment 32-3 are secured (as by adhesive) to the opposite sides 36N of the vane 70. When secured to the vane 70, the brush segment members 32M-1 and 32M-2 serve the same purposes as the above-described segments 32. Thus, each brush segment member of this embodiment has suitable thickness and physical characteristics as to enable fluid to flow from the shaft 46 (that supports the hub 72) to the disc through porous passages in members 32M-1 and 32M-2. The brush segment members 32M-1 and 32M-2, in conjunction with the vane 70, thus also have the above-described configuration for applying the forces FRT to the sides 26 of the discs 20 for scrubbing, rotating, and conveying the discs. In this embodiment, the vane 70 axially supports the members 32M-1 and 32M-2 so that the forces FRT may be applied axially as described above with respect to FIG. 4B, for example.

Figure 5C:
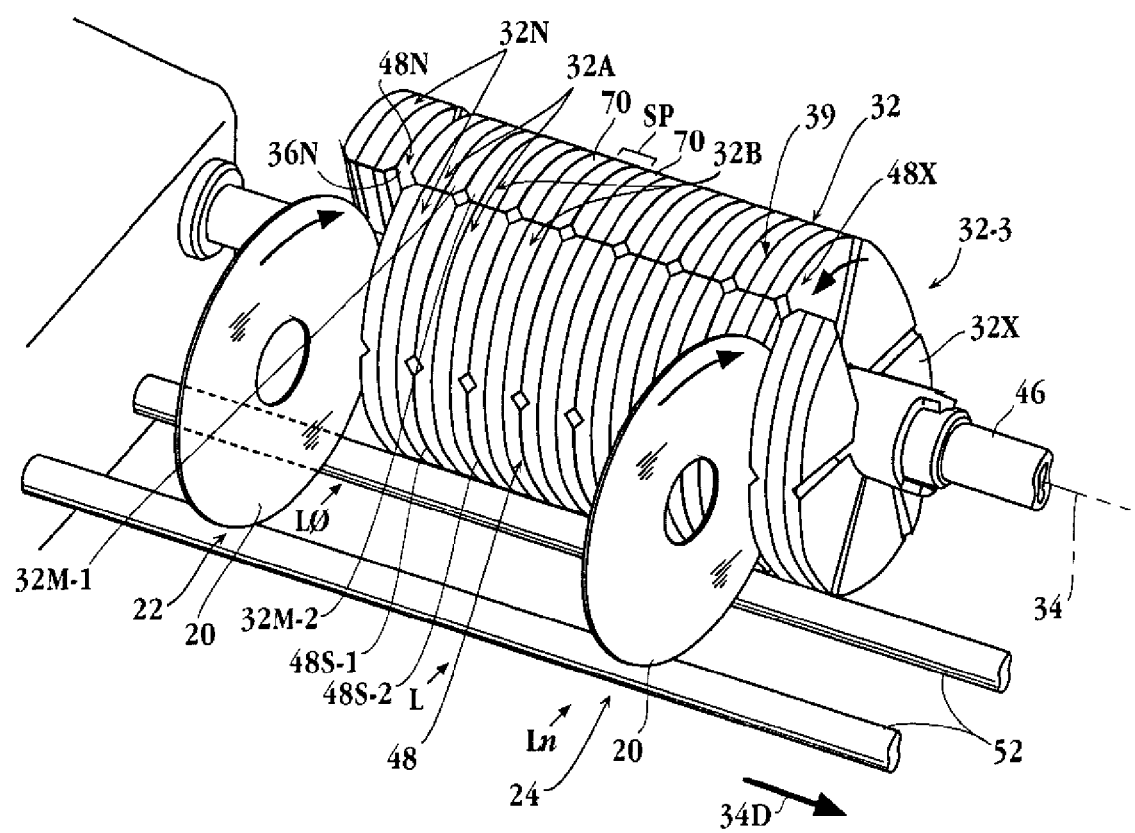
FIG. 5C is perspective view illustrating the spiral brush configured from many of the brush segments in accordance with one embodiment of the present invention.

FIG. 5C shows that the brush segments 32-3 are configured to be mounted adjacent to each other in both aspects described above. The brush segments 32-3 are configured with the entrance junction 48N at the entrance 22, and with the exit junction 48X at the exit 24, as described above. Thus, the discs 20 may be inserted into and removed from the brush 30-3 in the same manner as in the above-described embodiments, for example by the noted carrier (not shown). With the helical configuration of the vanes 70 and the segment members 32M, in all respects this brush embodiment 30-3 may scrub and convey the discs in the manner described above with respect to the segments 32-2 that do not have the vane 70, with the added characteristic of the rigidity of the vane providing more uniformity of the net force applied to the discs by the brush 30.

In more detail, FIG. 5B shows the brush segment 32-3 including the vane 70 extending helically around the axis 34 of rotation and radially away from the axis 34. FIG. 5A shows the first and second opposite helical sides 36N. The first brush member 32M-1 is configured extending helically adjacent to one of the helical sides 36N. The second brush member 32M-2 is shown configured extending helically adjacent to a second one of the helical sides 36N. The vanes 70 shown in FIGS. 5A-5C are further configured with the characteristic of rigidity that is in the direction 34D (FIG. 5C) parallel to the axis 34 to provide the above-described axial support of the members 32M. FIG. 5B shows each of the first and second brush members 32M secured to the respective opposite helical sides 36N of the vane 70. Such securing may be by an adhesive applied to the non-scrubbing surfaces 36N, wherein the adhesive retains adhesion in the presence of the fluids that are supplied through the grooves 37G, for example. As a result, the vane 70 and the members 32M on each side of the vane are configured to position the helical scrubbing surfaces 36S in a manner similar to the helical scrubbing surfaces 36 of the brush segment 32-2 for similar functioning.

FIG. 5B shows each of the brush members 32M further configured with the helical scrubbing surface 36S. Each scrubbing surface 36S corresponds to the surfaces 36 described above with respect to the segments 32-1 and 32-2. Based on FIGS. 5A & 5B, it may be understood that the brush segments 32-3 are characterized by each of the helical mounting surfaces 36N and helical brushing (or scrubbing) surfaces 36S being configured with the first end 42 and the second end 44. The ends 42 and 44 may be configured with interlocks 45 (FIG. 3B) as described above for the same interlock functions.

FIG. 5C shows the spiral brush 30-3 configured with many of the brush segments 32-3 that are shown in FIG. 5B. These brush segments 32-3 include exemplary first brush segment 32A and second brush segment 32B. The helical extent of the vane 70 and of the respective first and second brush members 32-M-1 and 32-M-2 of the first and second brush segments 32A and 32B are at a same angle S (FIG. 3C) with respect to the axis 34. With the hubs 72 configured with the interlocking couplers 72C and 72E, and with the vane 70 of segment 32A interlocked with the vane of segment 32B by interlock 45, each of the exemplary first and second brush segments 32A and 32B is further configured for connection to the other brush segment. The connection is both the adjacent axial abutting relationship in the direction 34D of the axis 34 and the rotary abutting relationship of ends 42 & 44. That adjacent relationship may be as described above. In one example, in FIG. 5C the first brush member 32M-1 of segment 32N is held next to the second brush member 32M-2 of segment 32A along the helical path to define the junction scrubber portion 48S-1 of the junction 48 that extends along the helical path. The junction 48 continues helically, and the above description of FIG. 3E is applicable to the brush 30-3. For example, FIG. 5C also shows that with the junction 48 of the brush 30-3 continuing helically, the brush member 32M-1 of segment 32A is adjacent to the brush member 32M-2 of segment 32B. Both members 32M-1 and 32M-2 are configured in the continuous relationship extending helically around the axis 34. These two members 32M-1 and 32M-2 thus define the continuous scrubber junction 48 extending in a plurality of the turns 39 around the axis 34.

In more detail, this embodiment of segment 32-3 is configured with each of the vanes 70 of each brush segment 32-3 having a particular pitch length PL (FIG. 5B) to define a space SP between adjacent turns 39 of the continuous vane 70. Each of the particular pitch lengths PL may be the same, or in one brush 30 the pitch length PL may be different in certain brush segments 32. The continuous first and second brush members 32M-1 and 32M-2 are further configured for reception in a respective space SP between the adjacent turns 39 of the continuous vane member 70. The received members define the helical scrubber junction 48 as being continuous. It may be understood from this description that the configuring for connection of each of the first and second brush segments 32-3 includes the hubs 72 (FIG. 5B) configured to lock with each other and the interlocks 45 (FIG. 3B) connecting ends 42 and 44. As a result, the helically extending vane 70 and the first and second brush members 32M-1 and 32M-2 of the first brush segment (e.g., 32A) cooperate with the helically extending vane 70 and the first and second brush members 32M-1 and 32M-2 of the second brush segment (e.g., 32B) to define the continuous vane member extending helically in a plurality of turns 39 around the axis 34. The cooperation also defines the continuous first brush member 32M-1 extending helically and adjacent to the respective first helical side 36N (FIG. 5A) and in the plurality of turns 39 around the axis. The cooperation also defines the continuous second brush member 32M-2 extending helically and adjacent to the respective second helical side 36N and in the plurality of turns 39 around the axis 34. FIG. 5C also shows the continuous first and second brush members 32M-1 and 32M-2 configured for reception in the given space SP between the adjacent turns 39 (FIG. 5B) of the continuous vane member 70 to define the continuous helical scrubber junction 48. In one embodiment, such reception may be with the first and second brush members 32M-1 and 32M-2 in the space SP in an axially-compressed condition that may result from the members 32M-1 and 32-2 having a configuration C (not shown) with a combined length in the axial direction 34D that is greater than the length of the space SP in the axial direction. An amount of the axial compression may, for example, result in the axial forces FRT and cause the moving continuous helical scrubber junction 48 to scrub the disc that is received in the continuous helical scrubber junction 48.

The description of FIG. 4B is applicable to the embodiment of FIGS. 5A-5C. Based on the FIG. 4B description, the hubs 72 of the brush segment 32-3 are configured to rotate around the axis 34 at the fixed axial location. Thus, referring to FIG. 5C, consider one rotation of the many adjacent brush segments 32-3 around the axis 34 and consider one location (e.g., Ln-1, FIG. 4B) that is along the axis 34 and that is at the given angle AA (FIG. 4A) around the axis. While the scrubbing occurs the junction 48 moves in the direction 34D through the distance equal to the pitch length PL to the exemplary second location Ln along the axis 34. In terms of the disc 20, FIG. 5C shows that in one embodiment the brush 30-3 may be configured with exemplary axially-separate junction scrubber portions 48S-1 and 48S-2 of the junction 48. These portions of the continuous helical junction 48 are between adjacent separate brush segments 32-3. Each of the two exemplary scrubber portions 48S-1 and 48S-2 receives and scrubs the opposed surfaces 26 of one of the plurality of discs 20, and simultaneously with the scrubbing conveys the disc in the direction 34D of the axis as described with respect to FIG. 4B.

Similar to the description of FIG. 3E, FIG. 5C shows one embodiment with the brush 30-3 configured so that, at the brush position at the entrance 22, the brush rotation causes the entrance junction 48N to become axially aligned with the location L0 for receiving a disc 20 in the junction scrubber portion 48S as described above. In the one embodiment, the brush 30-3 is configured so that at the exit 24 the brush rotation causes the junction 48 to become axially aligned with the location Ln. At location Ln the junction 48 is identified as 48X. The junction 48X at Ln allows a disc 20 in the junction scrubber portion 48S to leave the brush 30-3 on every rotation at which a disc is present.

The descriptions above relating to FIG. 3E are applicable to FIG. 5C. With this in mind, and in exemplary reference to brush 30-3 and to the brush segments 32-3 shown in FIGS. 5A-5C, the various "types of brush" (as defined above) may be provided for the various numbers N (not shown) of brush segments 32-3 as may be suitable for best removal of types of particle or surface conditions from the disc. This configuration of the brush 30-3 with a series of the next type of brush (i.e., brush segment 32-3) may be repeated as necessary, and for each type of brush the number N may be selected as appropriate. By providing different brush configurations C (not shown) in which there may be axially different scrubbing characteristics (e.g., C1, C2, etc.) of one brush 30-3 that is used to scrub a group of discs, not only may all of those discs be scrubbed by the same brush, but the scrubbing may be tailored for the initial and underlying conditions of the discs in the particular group of incoming discs. In addition, the delivery of the cleaning fluid to the disc during cleaning (e.g., through shaft 46) may be tailored, for example as described below with respect to FIGS. 6A-6G.

FIGS. 6A-6H illustrate aspects of other embodiments that are configured to combine features of the above-described embodiments to enable enhanced disc cleaning and conveying. For example, one embodiment provides the characteristics of the vane 70 (FIG. 5A). Also, the "type of brush" characteristics described with respect to FIG. 5C are enhanced by an embodiment of the brush 30 (referred to as brush 30-4). In that embodiment, the supply of fluid is to one embodiment of the brush segments 32 (referred to as 32-4) in which there are adjacent series of brush segments 32-4, each series having different brushing characteristics and supplied with different brushing fluid. In another embodiment, one brush segment 32-4 is configured to simultaneously be cleaned and scrub a disc. The brush segment members 32M are referred to in these embodiments as exemplary members 32M-F1 and 32M-F2 as described below.

Figure 6A:
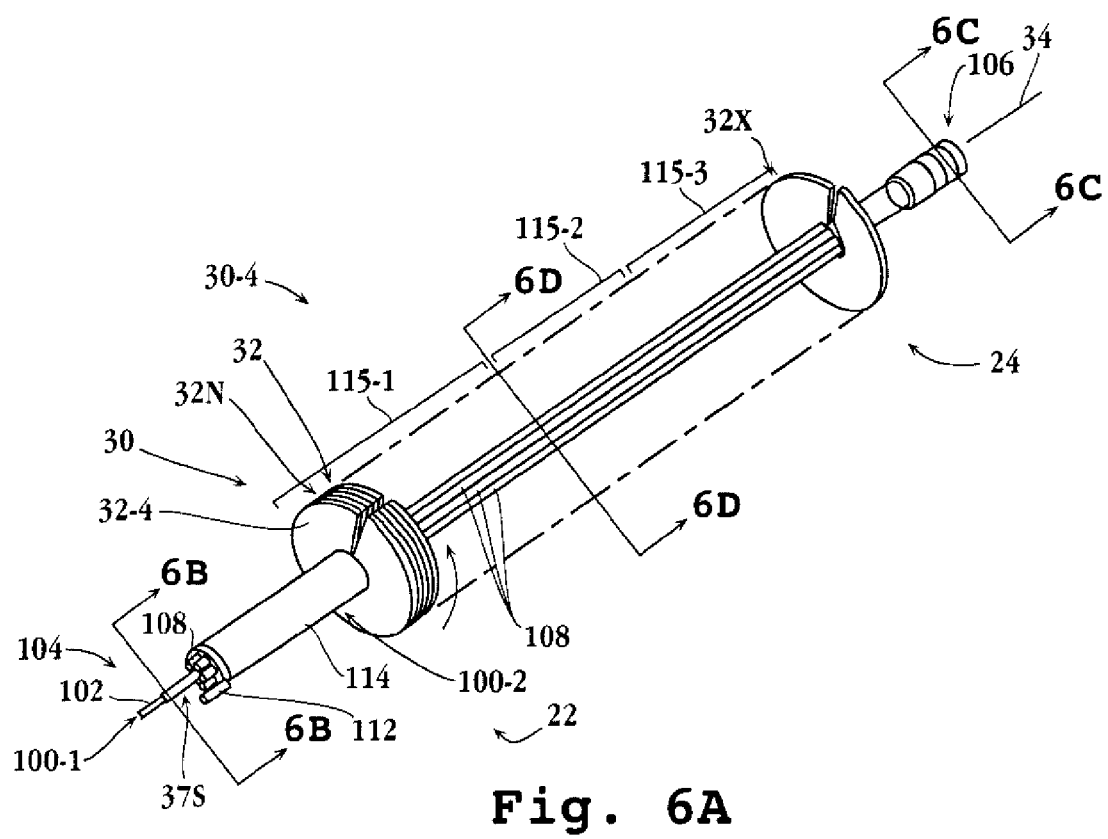
FIG. 6A is a perspective view of one embodiment of the present invention showing a shaft configured from many hollow pipes for fluid delivery and enhanced disc cleaning and conveying.
Figure 6B:
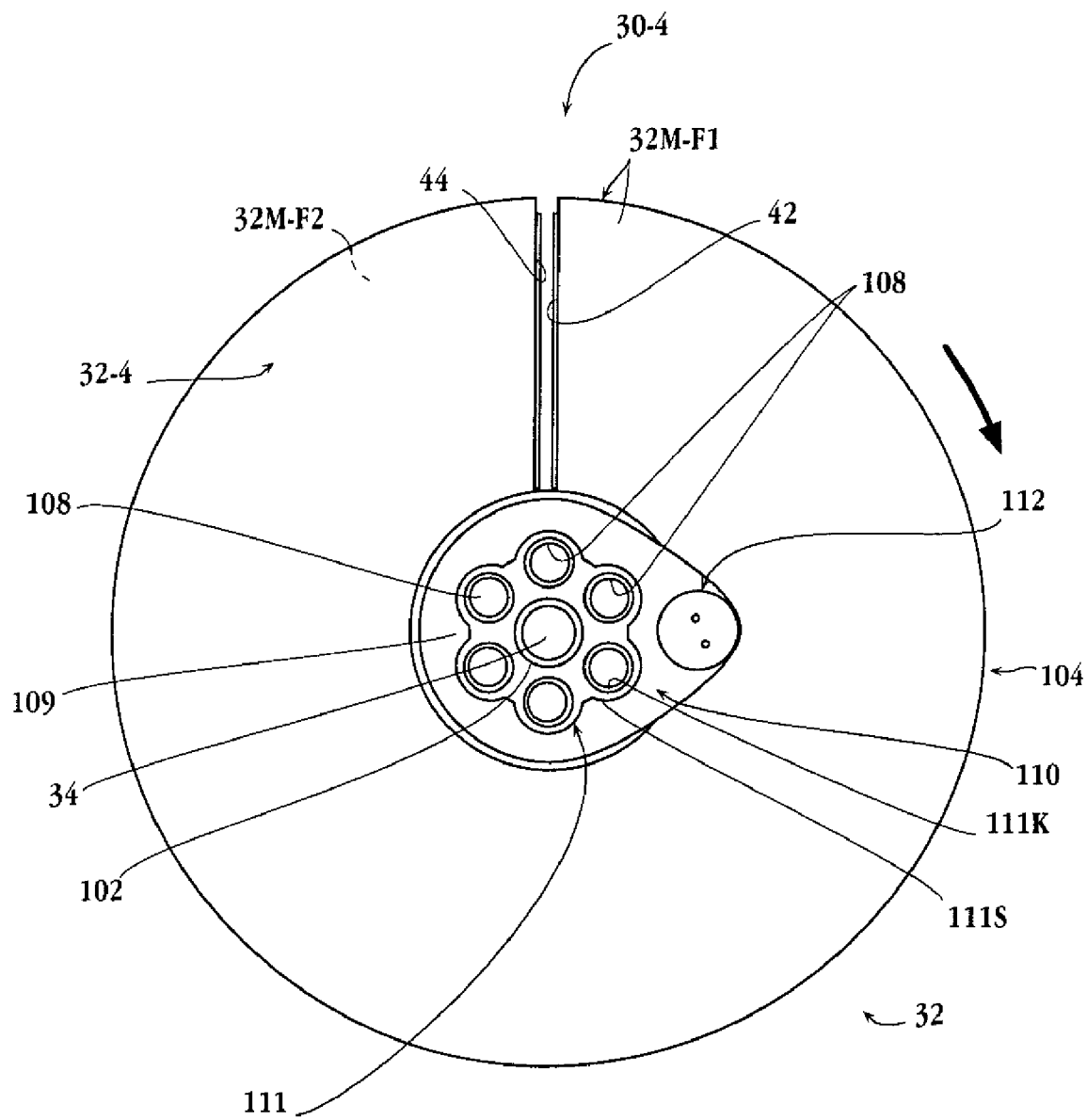
FIG. 6B is a view of the embodiment of FIG. 6A, illustrating a fluid inlet end of the shaft configured with the hollow pipes.
Figure 6C:
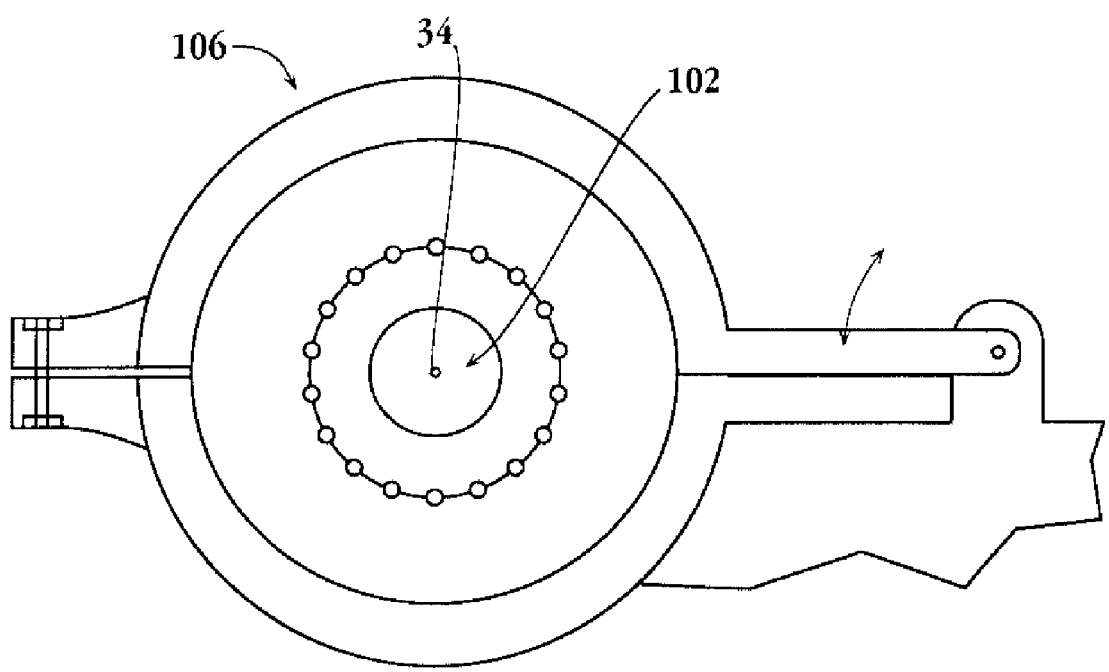
FIG. 6C is an end view of an opposite bearing end of the shaft, illustrating the shaft mounted in bearings that allow shaft rotation but not axial shaft movement in a direction of a brush axis.

Referring to FIG. 6A, in one embodiment of the brush 30-4, the shaft 37S may be configured in plurality axially-spaced shaft sections. One section 100-1 may be a central solid shaft 102 that extends from a fluid inlet end 104 to a bearing end 106. At the end 104, the shaft 102 is configured to connect to a bearing (not shown) that allows rotation but not axial movement in the direction of axis 34. FIGS. 6A & 6B show the fluid inlet end 104 configured with a plurality of hollow pipes 108. FIG. 6B shows the pipes arranged in a circular array 109 that is held and driven by a crank 110. The array 109 defines a spline configuration, or spline, 111. Outer portions of each pipe 108 define a key 111K of the spline. Crank 110 shown in FIG. 6B is journalled on the shaft 102 and is configured with key slots 111S that are evenly spaced around the axis 34. Each slot 111S receives one of the pipes 108. FIG. 6B shows crank 110 configured with a crank arm 112 eccentric with respect to the axis 34. A motor (not shown) may rotate the crank arm 112, and the crank arm 112 rotates the respective slots 111S that act on the respective spline keys 111K to rotate the array of pipes 108 around the axis 34. FIG. 6C shows that at the opposite bearing end 106, the shaft 102 is mounted in bearings that allow rotation but not axial movement of the shaft 102 in the direction of axis 34.

Referring again to the fluid inlet end 104 shown in FIG. 6A, the pipes 108 extend to the left past the crank 112 to facilitate connection to separate conduits of a rotary manifold (not shown) that allows the pipes 108 to rotate while separately supplying each pipe 108 with fluid. The rotary manifold controls fluid supply so that the fluid supplied to a specific one of the pipes 108 may be changed or remain the same, e.g., in a temporal manner. According to the embodiment of the brush 30-4, the fluid may be one of many types of (i) slurries for the disc scrubbing, or (ii) fluids for cleaning the scrubber surfaces 36 of the brush 30-4. Supply of such fluids for cleaning is described with respect to FIG. 6H and sectors 126BC the supply corresponding to when, for example, the junction scrubber portion 48S of the junction 48 shown in FIG. 4A is not in contact with the disc 20.

FIG. 6A shows that to the right of the crank arm 112 a shaft section 100-2 may contain a cylindrical spacer 114 mounted over the pipes 108. In one embodiment, the spacer 114 may be formed around the pipes 108 and be connected to the crank 110 to transmit torque to the pipes 108 and prevent twisting of the pipes around the axis 34. In another embodiment, an axial length of the spacer 114 may be related to the axial length of the noted carrier (not shown), for example. In this manner, the carrier may move toward the shaft 37S (in this embodiment toward the brush 30-4 mounted on the pipes 108) and not hit a series (see brackets 115-1, 115-2, & 115-3) of the brush segments 32-4 that extend axially from entrance 22 to exit 24. The brush segments 32-4 of the combined series 115 are shown extending axially for an axial distance that is related to the number of discs 20 that are to be cleaned and conveyed in one of the above-described groups that may be carried by the noted exemplary carrier (not shown). Also, the brush segments 32-4 of each series 115-1-115-3 may correspond to the configurations C (not shown) described above with respect to FIGS. 3E & 5C. Thus, series 115-1 may have a different brush scrubbing characteristic C that is different from a brushing characteristic C of series 115-2, for example.

Figure 6D:
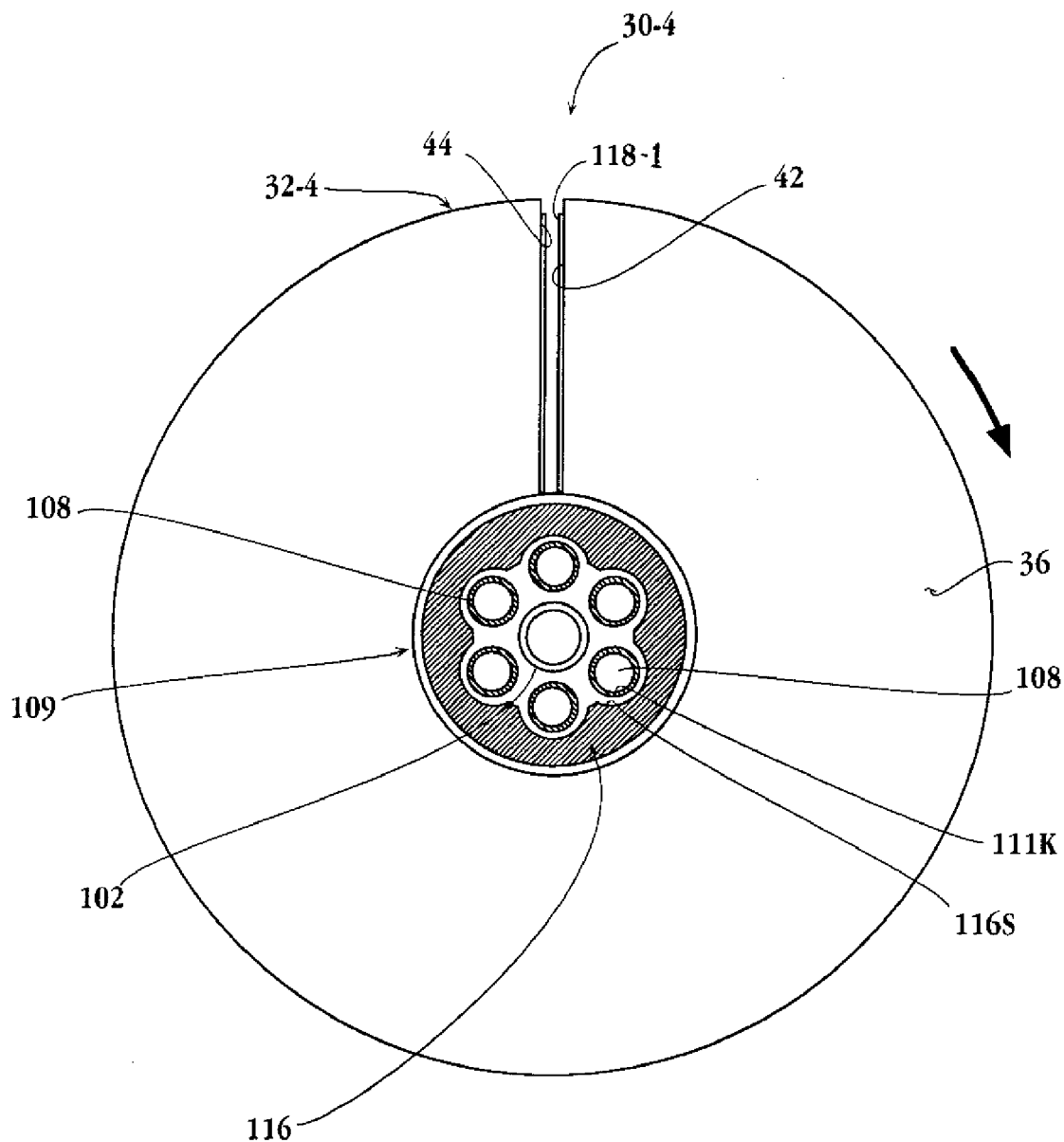
FIG. 6D is a cross sectional view taken on line 6D-6D in FIG. 6A, showing one of many brush segments mounted on the shaft, illustrating an array of the pipes defining spline keys received in spline slots formed in a hub.

FIG. 6D is a cross sectional view showing one of the brush segments 32-4. The array 109 of pipes 108 is shown with an exemplary one of the spline keys 111K located eccentric with respect to the shaft 102. The keys 111K are shown received in respective hub-spline slots 116S of a hub 116. The hub 116 of one brush segment 32-4 is configured to abut a hub 116 of an adjacent brush segment 32-4 in a desired adjacent axial relationship shown in FIG. 6A, and to thus provide the above-described adjacency of the adjacent brush segments 32-4. Also, the torque applied to the pipes 108 by the crank arm 112 is transferred through the keys 111K and slots 116S to the hub 116 and then to a spiral vane 118 (FIG. 6E) to rotate the brush segment 32-4.

Figure 6E:
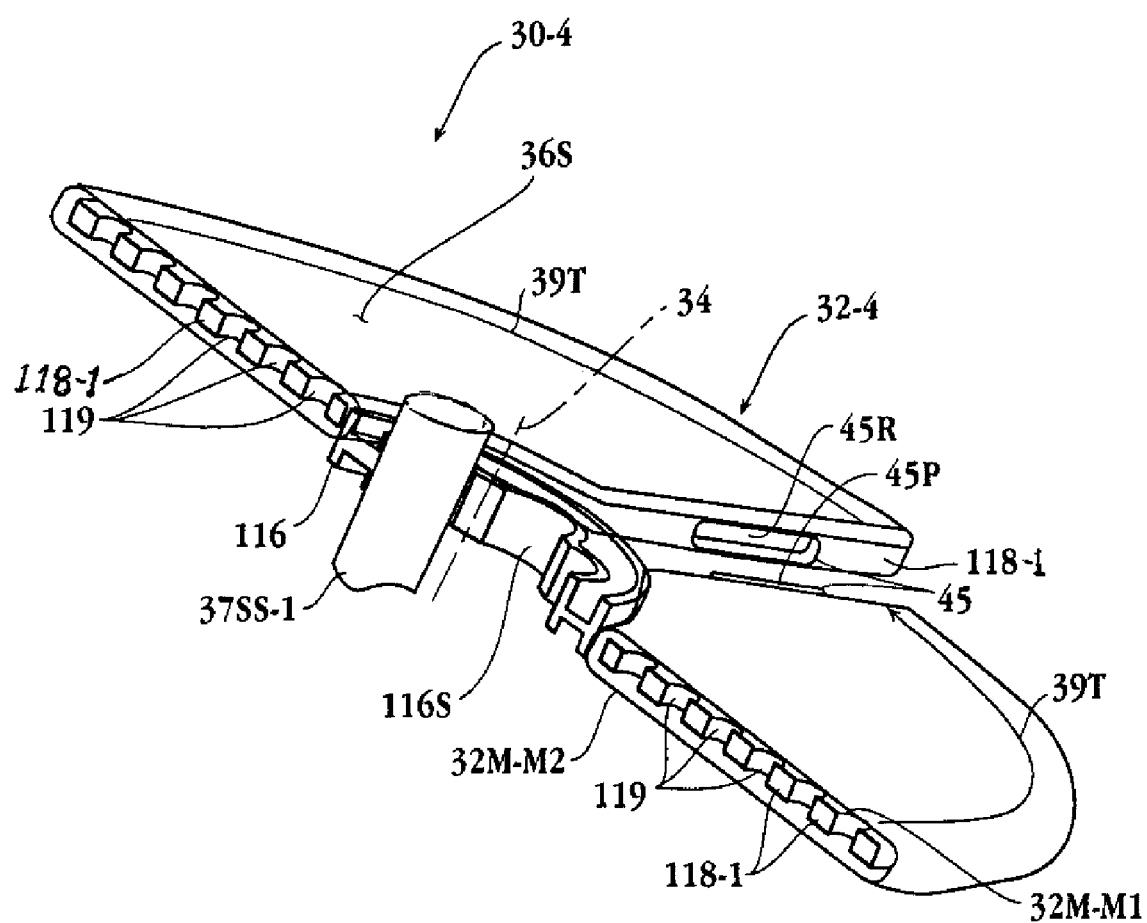
FIG. 6E is a cross sectional view taken on line 6E-6E in FIG. 6D, showing one of the brush segments with one of the pipes received in a respective hub-spline slot, the hub illustrated as being secured to a spiral vane.

FIG. 6E is another cross sectional view showing one embodiment of the brush segments 32-4. An embodiment of the shaft 37S is identified as 37SS, indicating that in lieu of the pipes 108 a plurality of solid rods 37SS-1, etc. may be received in respective ones of the hub-spline slots 116S. The hub 116 is shown secured to one embodiment of the spiral vane, identified as 118-1. Vane 118-1 is similar to the vane 70 (FIG. 5A), except as herein described. Thus, the spiral vane 118-1 is shown configured with a spiral shape that is the same as (i) vane 70 (FIG. 5A), and with (ii) a spiral shape of brush segment members 32M-M1 and 32M-M2 that are secured to opposite sides of the vane 118-1. Vane 118-1 is configured as a solid disc, with a series of holes 119 extending radially from the hub 116. For purposes of showing the holes 119, in FIG. 6E the brush segment members 32M-M1 and 32M-M2 are only shown covering the vane 118-1. It is to be understood that the brush segment members 32M-M1 and 32M-M2 extend into the holes 119 to secure the brush segment members 32M-M1 and 32M-M2 to opposite sides of the vane 118-1. Such extension may, for example, be by a molding operation. FIG. 6E shows that the vane 118-1 of the one illustrated segment 32-4 is configured to extend helically one turn 39 (see arrow 39T indicating part of the turn) around the axis 34. In a manner similar to vane 70, the vane 118-1 is configured from a rigid material effective to provide axial rigidity and to support spiral scrubbing surfaces 36S of the brush segment 32-4. This rigidity characteristic is in a direction parallel to the axis 34. In one embodiment, the vane 118-1 is also configured with the interlocks 45, including the projection 45P and recess 45R as described above.

Figure 6F:
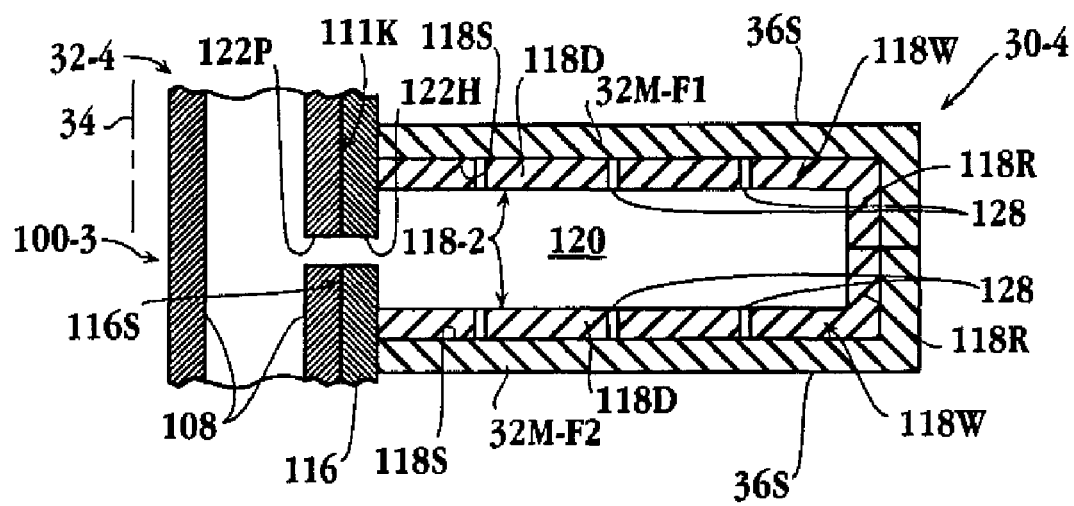
FIG. 6F is a cross sectional view showing one embodiment in which the spiral vane is configured with two dish-shaped pieces that are complementary and assembled with one vane piece facing the other vane piece.

With the vane 118-1 in mind, reference is also made to FIG. 6F. A vane embodiment identified as 118-2 is shown. Vane 118-2 has a radial extent and spiral shape similar to that of vane 118-1, but as is described below, the vane 118-2 is configured hollow for fluid supply. The cross sectional view of FIG. 6F shows the brush segment 32-4 with the vane 118-2 configured with an exemplary one of the pipes 108 received in the respective hub-spline slot 116S. The hub 116 is shown secured to the spiral vane 118-2. Vane 118-2 is shown supporting the embodiment 32-4 of the brush segment 32. The vane 118 is configured with spiral brush segment members 32M-F1 and 32M-F2 that are secured to opposite sides of the vane 118-2. The reference letter "F" indicates that embodiments of the vane 118-2 may be configured for supplying fluid to the brush segments 32-4. For example, fluid may be for use with axially-spaced different brushing characteristics (referred to as C, not shown). Also, an exemplary brush segment member 32M-F1 may be cleaned by a brush cleaning fluid when the surfaces 36S of the members 32M-F1 and 32M-F2 are not in contact with the disc 20. Similar to the showing in FIG. 6E of vane 118-1, the vane 118-2 is also configured to extend helically one turn 39 around the axis 34. The vane 118-2 is also configured from a rigid material effective to support and provide the characteristic of axial rigidity and to support spiral scrubbing surfaces 36S of the brush segment 32-4. This rigidity characteristic is in a direction parallel to the axis 34. In one embodiment, the vane 118-2 is also configured with the interlocks 45, including the projection 45P and recess 45R as described above and as shown in FIG. 6E.

FIG. 6F shows vane 118-2 in more detail, and for the fluid supply as being configured with two dish-shaped pieces 118D. Pieces 118D may be complementary, and for assembly into the one vane 118-2 are oriented facing each other. Each piece 118D may have a rim 118R. The rim 118R is spaced from the axis 34 and is attached to radially-extending walls 118W, so that the vane pieces 118D are plate-shaped, for example. The rims 118R are opposed to each other and touch, cooperating with walls 118W to define a manifold chamber 120, i.e., a hollow chamber within the vane 118-2. A section 100-3 of the shaft 37S is in the form of an exemplary one of the hollow pipes 108 that define the spline 111 (i.e., the key 111K). The pipe 108 is shown received in the hub-spline slot 1116S.

The brush 30-4 is shown in FIG. 6F further configured for communication from the hollow spline (key 111K) of the pipe 108 to the spline slot (hub-spline slot 116S) and to the manifold chamber 120. The communication is by way of a port 122P in the pipe 108 and a port 122H in the hub 116, the ports 122P and 122H being axially aligned to provide a fluid passageway connecting the exemplary pipe 108 to the manifold chamber 120. It is to be understood that the one pipe 108 and the ports 122P & 122H shown in FIG. 6F are representative of the configuration of the hub 116 and each pipe 108. In one embodiment each of the exemplary six pipes 108 shown in FIG. 6B may be communicated with the same manifold chamber 120 of the same vane 118. Thus, the configuration of the brush 30-4 for communication from each of the hollow splines (key 111K) to each of the spline slots (hub-spline slot 116S) and to this same manifold chamber 120 may in this way provide the fluid passageway connecting each exemplary pipe 108 to the same manifold chamber 120. In this manner, with a different fluid supplied to the pipes 108 in succession, different fluids may be supplied to the same manifold chamber 120 in succession, and the timing of the change of fluid supply (i.e., from one pipe & then from another pipe) may be coordinated with changes in the scrubbing requirements of particular groups of discs 20 received in the brush 30-4, for example, and moving past the brush segment 32-4 supplied with the different fluid.

Figure 6G:
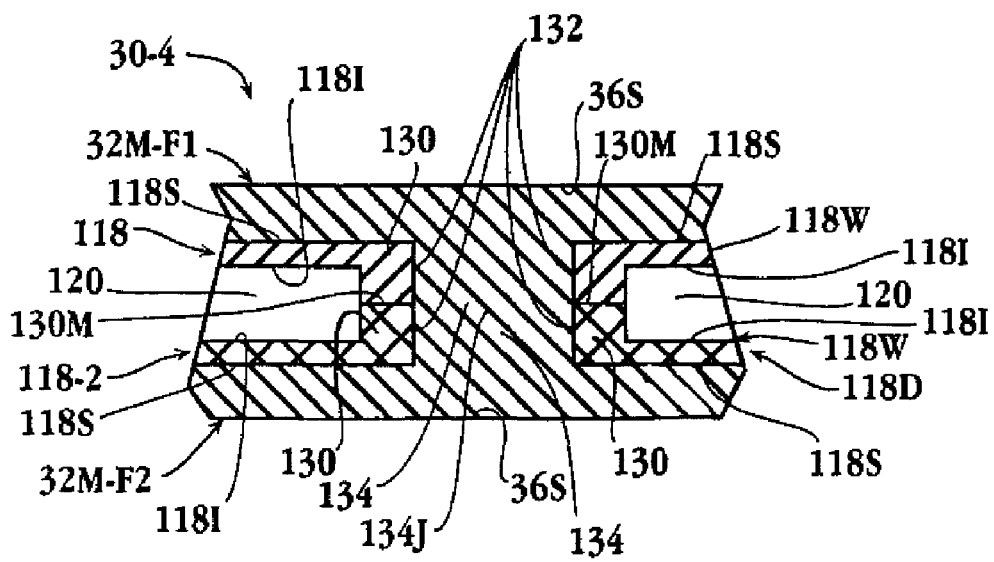
FIG. 6G is a cross sectional view showing the vane pieces assembled and opposed to each other with rims touching to define a manifold chamber within the vane.

FIGS. 6F & 6G also show the dishes 118D configured with opposed helical sides 118S of the walls 118W. Each wall 118W is shown in FIG. 6F configured with fluid distribution outlets 128 extending between the chamber 120 and the sides 118S. Each of the sides 118S is also configured to be covered by a respective one of the brush segment members 32M-F1 and 32M-F2. The outlets 128 supply the fluid from the chamber 120 to the brush members 32M-F1 & 32M-F2. In one embodiment, the members 32M-F1 and 32M-F2 may be secured to the sides 118S and rims 118R using adhesive.

Figure 6H:
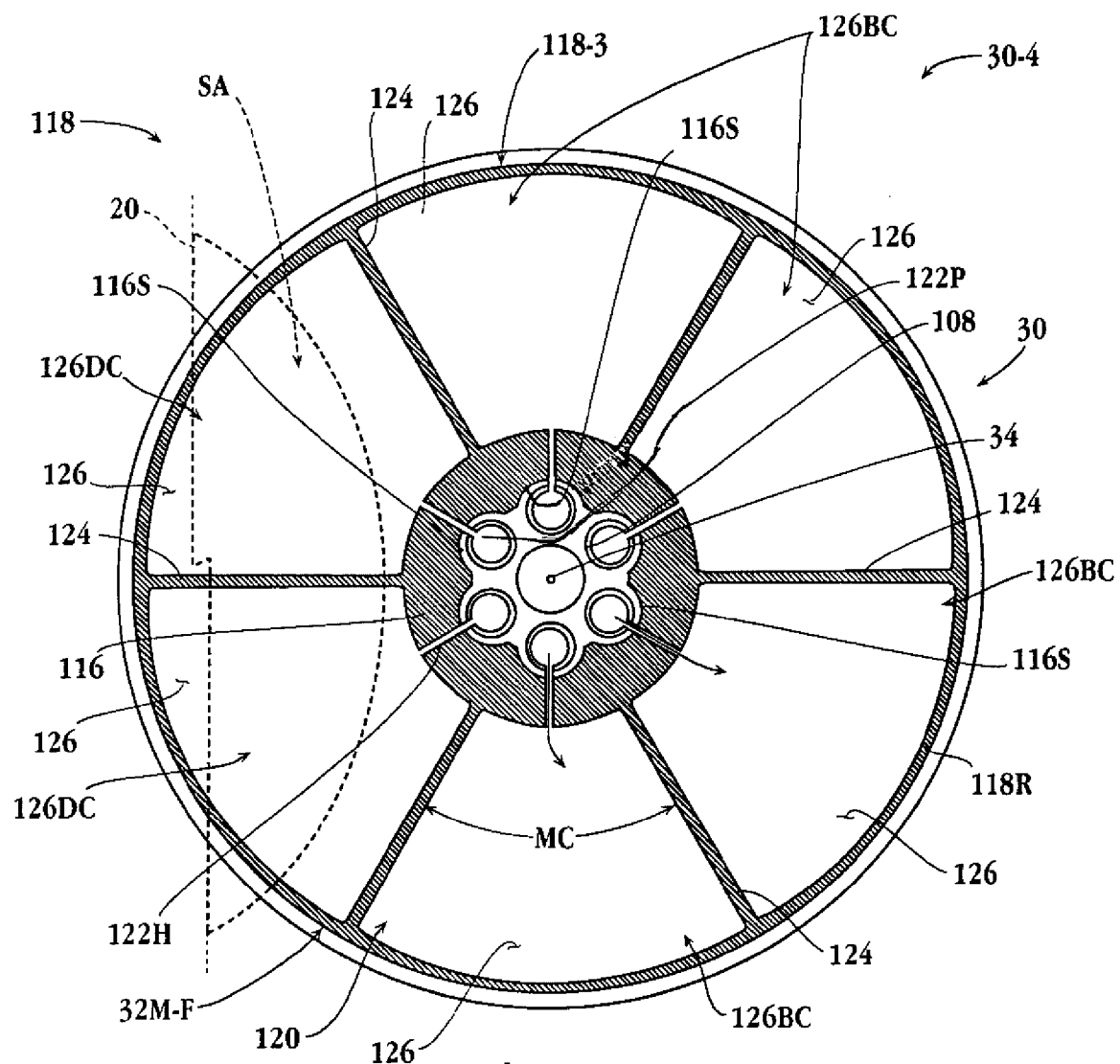
FIG. 6H is a cross sectional view showing one embodiment of the vane, illustrating the chamber open and extending radially across the assembled dishes and radially-extending webs dividing the chamber into sectors.

In another embodiment shown in FIG. 6G, the members 32M-F1 and 32M-F2 may be formed over the sides 118S and rims 118R of dishes 118D of the vane 118-2 to define the brush segment 32-4. To retain the members 32M-F1 and 32M-F2 assembled with the vane 118-2 by exemplary molding, each dish 118D may be configured with bosses 130 extending from an inside surface 118I. The bosses 130 extend parallel to the rim 118R. In one embodiment, there may be a row (or array) of the bosses 130, and in one embodiment the row may be configured extending radially from near the hub 116 to the rim 118R (similar to the extent of the holes 119 in FIG. 6E). Preferably there are spaces of the chamber 120 between the bosses 130. In another embodiment (not depicted in FIG. 6H), the row of bosses 130 may be configured within the web 124 that extends radially as shown in FIG. 6H. In any such embodiment, FIG. 6G shows the bosses 130 defining apertures 132 extending through the boss 130 from side 118S to inside surface 130M that touches the opposite boss 130. Sides 118I are the insides of the chamber 120. FIG. 6G shows that in the exemplary molding for assembly of the brush segment members 32M-F1 and 32M-F2 with the vane 118-2, a bridge 134 extends from each side 118S into a respective one of the apertures 132. The bridges 134 in each same respective aperture 132 join during the exemplary molding. The joining may be between surfaces 130M, to adhere the respective first and second brush members 32M-F1 and 32M-F2 to the respective opposite helical sides 118S of the vane 118-2 and to the rims 118R. In this manner, the vane 118-2 is enclosed by the members 32M-F1 & 32M-F2. As joined, FIG. 6F shows the bridges identified as 134J. When the bridges 134J are so joined, the assembled vane 118-2 and members 32M-F1 and 32M-F2 serve the same brushing purposes as the above-described segments 32. Thus, each brush member of this embodiment has suitable thickness and physical characteristics as to enable fluid to flow through porous passages of the first and second brush members 32M-F1 and 32M-F2 to the disc that is being cleaned, or to clean the brush, as the case may be according to the current exemplary time period TBC or TDC described below. The flow through the porous passages is from the pipe section 108 of the shaft that mounts the hub 116 to the vane 118, and from the manifold chamber 120 of the vane 118-2 and from the outlets 128 of the chamber 120 into the porous passages.

Considering the separate fluid supply from one pipe 108 to one chamber 120 of one vane 118, reference is made to FIG. 6H, a cross sectional view showing one embodiment of the vane (identified as 118-3). The FIG. 6H embodiment contrasts with the FIG. 6F embodiment that shows the manifold chamber 120 configured with the chamber 120 open and extending radially across the entire assembled dishes 118D from hub 116 to rim 118R, and open all around the axis 34 (e.g., 360 degrees around). The FIG. 6H embodiment shows the manifold chamber 120 similarly configured with the chamber 120 open and extending radially across the entire assembled dishes 118D from hub 116 to rim 118R. However, that chamber 120 of vane 118-3 in FIG. 6H is not open all around the axis 34 (e.g., 360 degrees around). Rather, two or more dams (or radially-extending webs) 124 are provided connected between the rim 118R and the hub 116. The webs 124 divide the manifold chamber 120 into sectors 126, each of which is an arcuate portion of the chamber 120 (in FIG. 6H having an angle MC) extending around the axis 34). In one embodiment the angle may be 60 degrees, when e.g., there are six equal-angle sectors 126. Other numbers of sectors 126 may be provided, with appropriate angular extents, and with the webs 124 positioned to provide the desired angular configuration. In the exemplary six pipe and six sector embodiment shown in FIG. 6H, each pipe 108 is shown communicating with only one separate sector 126, so that the supply of fluid to that one pipe 108 and sector 126 may be of a different fluid or pressure than is supplied to another one of the pipes 108 and sectors 126. The benefit of this configuration may be appreciated by reference to FIG. 4A. It is recalled that the area SA is a contact area of the junction scrubber portion 48S, e.g., between the brush and the area 54 of the disc. In FIG. 2E the arcuate extent of the area SA is shown by arc AAA, and is less than 360 degrees.

In FIG. 6H the contact area SA is shown in relation to part of a disc 20 (shown in dashed lines) received in an embodiment of the brush 30-4 having an exemplary six sectors 126 (each, e.g., of sixty degrees in the arc). In this embodiment with the exemplary six sectors 126, two exemplary sectors (referred to for description as 126DC, for disc cleaning) may be provided and correspond with the area SA of the brush 30-4 that is in contact with the disc 20. With each sector 126DC communicating only with one pipe 108, the exemplary two pipes may supply the brush cleaning fluid to the respective sectors 126DC only during a respective disc cleaning time period TDC that corresponds to the appropriate portion of one revolution of the brush segment 32-4 around the axis 34. This exemplary embodiment of the brush 30-4 is therefore configured to supply fluid to each of those two sectors 126DC and to each only during the respective time period TDC so as to provide fluid suited only for the disc cleaning (and not for the brush cleaning) during that respective time period TDC. The supply of fluid for disc cleaning is also temporal in nature in that any one pipe 108 will only supply the disc cleaning fluid for the period of time TDC in which the respective communicated sector 126DC is contacting the disc 20.

In this embodiment with the exemplary six sectors 126, an exemplary four of such sectors 126 (referred to for description as 126BC, for brush cleaning) may be provided and correspond with the area SA of the brush 30-4 that is not in contact with the disc 20. With each sector 126BC communicating only with one pipe 108, the exemplary four pipes 108 may supply the brush cleaning fluid to the respective sectors 126BC during a brush cleaning time period TBC. Period TBC corresponds to the appropriate portion of one revolution of the brush segment 32-4 around the axis 34. For the four exemplary sectors 126BC, two-thirds of a revolution may correspond to 1.3 seconds at 30 RPM. This exemplary embodiment of the brush 30-4 with the vane 118-3 is therefore configured to supply fluid to each of those exemplary four sectors 126BC and to each such sector only during a respective time period TBC so as to provide fluid suited only for the brush cleaning and not for the disc cleaning during that time period TBC. Thus, the configuration of the brush 30-4 for the supply of fluid for brush cleaning relates to temporal fluid supply, in that any one pipe 108 will only supply the brush cleaning fluid for the period of time TBC in which the respective communicated sector 126BC is not contacting the disc 20.

In review, in one embodiment the shaft 102 combines with the spacer 114 and the pipes 108 to support the hubs 116 both axially-abutting and for rotation around the axis 34. The respective hubs 116 support and rotate the respective vanes 118. Each vane supports and rotates the members, e.g., vane 118-1 supporting members 32M-M1 and 32M-M2, so that the abutting brush segments 32-4 apply forces FRT axially onto the discs as described above with respect to FIG. 4B, for example. Those forces effect scrubbing of the discs that contact the junction scrubber portions 48S at areas SA. The above-described net axial force is applied to each disc in the direction 34D toward the exit 24. Also, in a manner similar to that shown in FIG. 5C, in one embodiment the exemplary brush segments 32-4 of one brush 30-4 are configured to provide the entrance junction 48N at the entrance 22, and the exit junction 48X at the end 24, as described above. Thus, the discs 20 may be inserted into and removed from the brush 30-4 in the same manner as in the above-described embodiments. With the helical configuration of the vanes 118 and of the exemplary segment members 32M-F1 and 32M-F2, in all respects this brush embodiment 30-4 may scrub and convey the discs in the manner described above with respect to the segments 32-2 that do not have the vane 118, with the added characteristic of the rigidity of the vane 118 providing more uniformity of the forces FRT and of the net force applied to a disc by the brush 30-4. Additionally, as described above with respect to the pipes 108, ports 122P, holes 122H, and the sectors 126 defined by the webs 124 of vane 118-3, in one embodiment the brush segments 32-4 are configured so that many different fluids may be supplied to the sectors 126, including for example in the temporally-spaced manner to clean the portions of the brush segment members 32M-F1 and 32M-F2 that are not in contact with the disc 20.

In further review, FIG. 6A shows an embodiment of the brush 30-4 configured with many of the individual brush segments 32-4 (FIG. 6E) arranged in the adjacent relationship described above. The above descriptions apply to the brush segments 32-4. Thus, the helical extent of the vanes 118 and of the respective first and second brush members 32M-F1 & 32M-F2 may be at a same angle S (FIG. 3C) with respect to the axis 34. With the hubs 116 urged together from the opposite ends 104 and 106, and with the vanes 118 interlocked by interlocks 45, the exemplary brush segments 32-4 define one continuous spiral brush 30-4. The segments 32-4 are in both the adjacent axial abutting relationship in the direction 34D of the axis 34 and the rotary abutting relationship of ends 42 & 44. That adjacent relationship may be as described above.

The above descriptions of FIGS. 3E and 5C are also applicable to the brush 30-4. For example, in the manner shown in FIG. 5C, the scrubber junction 48 of the brush 30-4 may include the brush members 32M-F1 & 32M-F2 configured in the continuous relationship extending helically around the axis 34. The exemplary continuous brush members 32M-F1 & 32M-F2 of each adjacent brush segment 32-4 are also oriented facing each other and may define the normally-closed (as described above) continuous scrubber junction 48 extending in a plurality of the turns 39 around the axis 34. In one embodiment the brush 30-4 is configured with each of the vanes 118 of each brush segment 32-4 having a particular pitch length PL (FIG. 5B) to define the space SP between adjacent turns 39 of the continuous vane 118. Each of the particular pitch lengths PL may be the same. In another embodiment, for the series 115-1 the particular pitch lengths PL may be the same, and for the series 115-2 the particular pitch lengths PL may be the same, but different from the pitch lengths of the series 115-1.

The description of FIG. 4B is applicable to the embodiment of FIGS. 6A-6H. Based on the FIG. 4B description, in the brush 30-4 the hubs 116 of the brush segment 32-4 are configured to rotate around the axis 34 at the fixed axial location. During one rotation of the many brush segments 32-4 around the axis 34, and with respect to one location (e.g., Ln-1, FIG. 4B) along the axis 34 and at the given angle AA (FIG. 4A) around the axis, while the scrubbing occurs the junction scrubber portion 48S of the junction 48 moves in the direction 34D through the distance equal to the pitch length PL to the exemplary second location Ln along the axis 34.

The descriptions of FIGS. 3E & 5C are applicable to the embodiments shown in FIGS. 6A-6H. Based on these FIGs., it may be understood that many brush segments 32-4 may be provided to configure the brush 30-4 between the entrance 22 and the exit 24. The last segment 32-4 (e.g., segment 32X) may also be referred to by 32n, where "n" identifies a last segment of many segments, and "n" may be in a range of from about 3 to about 100. Any number of adjacent ones of these brush segments 32-4 may be grouped into similar junction units 48U, and in FIG. 6A the groups are shown as 115-1, 115-2, etc. In each case, there is a junction 48 between the respective scrubbing surfaces 36 of the respective adjacent segments 32-4, and each junction 48 may be the above-described axially-moving junction scrubber portion 48S. As a result, by the action of the disc inserter (or carriage) selected (e.g., every or every other) helical junction 48 may receive a disc at location L0. The discs are axially moved and cleaned by the scrubbing action noted above during the time period TCT. Then, at location Ln one-by-one the discs are removed from the respective helical axially-moving junction scrubber portions 48S. It may be understood that all of the discs 20 that are inserted in the brush 30-4 are scrubbed by the same brush 30-4, such that the embodiments of the present invention provide a configuration in which all discs are cleaned by the same brush 30-4.

The descriptions above relating to FIGS. 3E & 5C are applicable to embodiments of the brush 30-4. For example, the various "types of brush" (as defined above) may be provided for various numbers N of brush segments 32-4 of the series 115 as may be suitable for best removal of types of particle or surface conditions from the discs 20. The numbers N of brush segments 32-4 may be identified as N1, where N1 segments 32-4 are part of the segments 32-4 of the series 115-1, and additional numbers N2, N3, etc., may be other parts of the segments 32-4 of other series 115-2, 115-3 of the brush 32-4. Thus, this configuration of the brush 30-4 with the series 115 of segments 32M, the types of brush may be repeated as necessary, and for each type of brush of a series 115 the number N may be selected as appropriate.

Thus, embodiments described with respect to FIGS. 6A-6H may also provide different successive brush configurations C (not shown) in which there may be axially different scrubbing characteristics (e.g., C1, C2, etc., not shown) of one brush 30-4 that is used to scrub all of the discs. Not only may all of those discs be scrubbed by the same brush, but the scrubbing of each group may be tailored for the initial and underlying conditions of the discs by the configuration of the segments 32M of the particular series 115, and by the fluids applied to those series 115. Thus, referring to the above description of FIG. 6G, in one embodiment of the brush 30-4 the delivery of the fluid to the brush 30-4 during disc cleaning (e.g., through the pipes 108) may be tailored, for example, in conjunction with the different successive brush configurations C in which there may be axially different scrubbing characteristics (e.g., C1, C2, etc.) of the one brush 30-4. For example, reference is made to (i) the above description of separate fluid supply from one pipe 108 to one chamber 120 of one vane 118, and (ii) the FIG. 6F embodiment of the vane 118 (the manifold chamber 120 configured open all around the axis 34). The following features may be provided in one embodiment of the brush 30-4 by communicating one pipe 108 (described as 108N1 but not shown) with the manifold chambers 120 of each of the brush segments 32-4 of the exemplary number N1 of segments 32-4 of one exemplary series 115-1. This communicating is also configured by communicating a different one of the pipes 108 (described as 108N2 but not shown) with the manifold chambers 120 of each of the brush segments 32-4 of the exemplary number N2 of segments of a different exemplary series 115-2. This communicating is also configured in this manner for each of the other different pipes 108 and with a respective manifold chamber 120 of each of the brush segments 32-4 as corresponds to the additional exemplary numbers (e.g., N3, N4, etc.) of segments 32-4 of further different exemplary series 115-3 and 115-4, etc. Thus, the communication from one pipe 108 to the exemplary number N of segments 32-4 of series 115-3 is by way of one port 122P in the pipe 108 and one hole 122H in the hub 116 corresponding to each of the segments 32-4 of the one series 115-3. In one embodiment of the brush 30-4, each segment 32-4 of each different series 115 may be provided with a different fluid that is unique to the series 115, where the fluid may enhance the respective axially different scrubbing characteristic C of the respective segments 32-4 of the series 115.

In one embodiment, a method is provided for making a brush segment. The brush segment may be the brush segments 32-4 described above, for example. The method may include an operation of configuring the spiral vane with an aperture extending from one opposite helical side to the other opposite helical side. The spiral vane may be vane 70 described with respect to FIG. 5A or the vane 118 shown in FIG. 6E, for example. The aperture may be aperture 119 shown in FIG. 6E, for example. The method may move to an operation of extending a bridge from each of the brush members into the aperture. The brush member may be member 32M-F1 or 32M-F2 shown in FIG. 6G, for example. The bridge may be bridge 134 shown in FIG. 6G, for example. The method may move to an operation of joining the bridges in the aperture to adhere the respective first and second brush members to a respective one of the opposite helical sides of the vane. The joining of the bridges may be at junction 134J shown in FIG. 6G, for example. The joined bridges 134 are shown in FIG. 6G adhering the respective first and second brush members 32M-F1 and 32M-F2 to a respective one of the opposite helical sides 118S of the vane 118.

The method of making the brush segment may be further understood by reference to FIG. 6F, in which configuring of the vane from two dish-shaped plates 118D is shown. Each plate 118D defines an interior wall 118W and further defines one of the opposite helical sides 118S of the vane 118. In FIG. 6F, configuring of each plate 118D may be with an array of bosses 130, the bosses 130 extending from the respective wall 118W into the chamber 120. Each boss 130 is shown configured with one of the apertures 132. Orienting of the plates 118D with pairs of respective bosses 130 of each plate touching is shown in FIG. 6F, and in FIG. 6G the orienting is shown being with the respective apertures 132 of the touching bosses 130 aligned. The extending and joining operations may be performed by filling the aligned apertures 132 and covering each plate 118D with a unitary brushing material (e.g., 32M-F1 or 32M-F2) to define the respective brush segment 32-4 adjacent to each respective helical side 118S and to join the plates 118D together to form the brush segment 32-4.

The method of making the brush segment may be further understood by reference to FIG. 6F, in which a further configuring of the vane 118 is shown. Axially-spaced walls 118W define the manifold chamber (or cavity) 120 extending away from the axis 34 along the opposite helical sides 118S. Each wall 118W may be fabricated from porous material, or as shown the apertures 128 may be provided to allow fluid to flow from the chamber 120 to the members 32M-F1 and 32M-F2, for example, for brushing the discs 20. Additionally, the respective operations of extending and joining may be performed by an operation of molding a brushing material around the opposite helical sides 118S of the vane 118. The molding operation may fill the aligned apertures 132 with the brushing material to define and join the bridges 134, while covering each respective opposite helical side 118S of the vane 118-2 with the unitary brushing material to define the respective brush member 32M-F1 and 32M-F2 adjacent to each respective opposite helical side. The brushing material may be as described above. For example, the brushing material may be composed of porous material, with the porosity being with respect to the brush cleaning fluid and the disc scrubbing fluids described above. With each opposite helical side 118S of the vane 118-2 porous (e.g. with the apertures 128), the brush segment is thus configured to supply such fluids from the manifold cavity 120 to and through each of the brush members 32M-F, for example, to the discs 20.

In review of the descriptions of FIGS. 3A-3E and 4A-4C, there is illustrated an embodiment 30-2 of the spiral brush 30 for scrubbing the disc 20 having the opposite sides 26. This brush 30-2 may be configured with a brush member configured from one or more scrubbing materials described above, wherein the member has the axis 34 of rotation. The member may be further configured with the slit 31 extending along a helical path relative to the axis 34 of rotation. In this embodiment, the slit 31 may be configured as the junction 48, and references below to the junction 48 are also references to the slit 31 described above. FIG. 4B shows that the junction 48 may be configured to define the opposed (or adjacent) helical scrubber surfaces 36 configured to receive the discs 20. The surfaces 36 may touch each other or be spaced by less than the thickness T of the disc. The opposed surfaces 36 become spaced (or further spaced) upon insertion of the disc into the junction, and are referred to as being separable to receive the disc 20.

In further review, FIG. 3E shows the spiral brush 30 for scrubbing the workpiece 20 having the opposite sides 26. The brush member shown in FIG. 3E is configured from the above-described scrubbing material and has the axis of rotation 34. The brush member is configured with the slit in the form of the junction 48 (e.g. junction 48N), and the junctions 48 are described as extending along the helical path relative to the axis 34 of rotation. The slit (unction) 48 is configured to define the opposed helical scrubber surfaces 36 (e.g., FIG. 3D) that may touch each other, where the opposed helical scrubber surfaces 36 are configured to receive the workpiece 20. As described with respect to FIG. 4B, the brush member is configured to apply the forces FRT to the opposite sides 26 of the workpiece 20 received by the opposed helical scrubber surfaces 36 to effect scrubbing of the workpiece sides 26. As described with respect to FIGS. 2E & 4B, the surfaces 36 of the junction 48 are configured to convey the workpiece in the direction 34D of the axis 34 during the scrubbing.

FIG. 3E shows the brush further configured elongated with the entrance 22 and the exit 24 spaced along the axis 34. At the entrance the slit 31 and junction 48 are further configured to define the entrance brush segment portion 48N configured to guide the workpiece into the slit 31 or junction 48. Similarly, FIG. 3E shows the brush member configured at the exit end 24 (e.g., with segment 32X) so that the slit 31 and junction 48 are configured to define the brush exit segment portion (or exit) 48X to facilitate removal of the workpiece from the slit or junction.

In further review, FIG. 4B shows the brush 30-2 with the bore 37B that is coaxial with the axis 34. The shaft 46 is configured as the tube 46 for reception in the bore 37B to rotate the brush member around the axis 34. The brush 30-2 is configured with segments 32 in the form of bodies that extend radially away from the shaft 46 to define the helical scrubber surfaces 36 and receive about one-third of the area of the opposite sides 26 of the disc 20 received in the junction 48 to effect scrubbing of the sides 26. The shaft 46S is configured to rotate at the described fixed axial location, and rotates the brush 30-2 at that location to cause the rotating junction 48 at the angle A (FIG. 2E) to advance axially (see rate AM) and move the received disc 20 from the entrance end 22 to the exit end 24 in the direction of the axis 34 (arrow 34D).

In further review, FIG. 6B shows the brush 30-4 with the hub 116 configured with a bore comprising the spline slots 116S that are coaxial with the axis 34. The shaft is configured from pipes 108 that serve as hollow splines (spline keys 111K), a key 111K being received in each spline slot 116S to support the brush member 32-4. FIGS. 6F & 6G show the brush 30-4 further configured with the manifold chamber 120 and with the spline slot 116S. The brush is shown further configured with the shaft in the form of the hollow splines, e.g., the pipes 108, with a key 111K of each pipe received in one of the spline slots 116S. The brush is further shown configured for communication from the hollow spline (e.g., a pipe 108) to the spline slot 116S and to the manifold chamber 120. The ports 122H and 122P provide such communication. The manifold chamber 120 is shown in FIG. 6F further configured for communication with the opposed helical scrubber surfaces 32M-F1 & 32M-F2, e.g., and the communication may be flow of brushing fluid to facilitate the opposed helical scrubbing surfaces 36 scrubbing the workpiece, or may be brush cleaning fluid to facilitate the opposed helical scrubbing surfaces 36 cleaning the brush 30-4, as described above. One embodiment of the brush segment 32-4 is shown further configured with the hollow manifold chamber 120. The chamber 120 is configured with a plurality of the separate sectors 126. Each particular spline slot 116S and a corresponding hollow spline 111K are configured to communicate (via the ports 116P and 116H) with a particular one of the sectors (e.g., 126BC) of the hollow manifold chamber 120.

In further review, FIG. 3A shows the brush 30-2 configured with one of the adjacent helical turns 39. Each turn 39 may thus be defined by one brush segment 32-2 and may extend about 360 degrees around the axis 34. In FIG. 3D, each turn 39 is shown adjacent to another turn and the turns touch at the slit 31 (e.g., the junction 48). The turns 39 (or brush segments 32-2) may be configured as described above with respect to the configurations C. The above-described first type of brush segment may correspond to an exemplary pair of the segments 32-2, e.g., to the adjacent turns 39 configured from scrubbing material having the same scrubbing characteristic, i.e., same exemplary configuration C1. The turns 39 may also be configured so that the above-described second type of brush segment 32-2 may be an exemplary pair of the segments 32-2, e.g., adjacent turns 39 configured from scrubbing material having the same scrubbing characteristic, wherein the scrubbing characteristics of the first and second pairs of segments and turns may be different (e.g., C1 & C2). As a result, as the disc 20 advances axially the disc may be subjected to different types of scrubbing.

In further review, FIG. 3A also shows the brush 30-2 configured with a brush segment 32 (shown as 32-2), the brush segment 32 being configured to extend radially relative to (or from) the inner surface 410 (corresponding to the bore 37B, FIG. 4B) and away from the axis 34. The brush 30-2 thus defines a helical area of the helical scrubber surfaces 36. The area extends from the inner surface 411 to the outer perimeter 410 of the brush 30-2. FIG. 3A also shows the shaft 46 received in the bore 37B. FIG. 3B shows the surface 36 of the brush member being further configured with at least one groove 37G in one of the helical scrubber surfaces 36, and the at least one groove is shown as a plurality of the grooves 37G. One or more similar grooves 37G may be provided on the opposite side of the junction 48 in the opposite surface 36, and these grooves 37G may extend radially away from the axis 34. The shaft 46 is shown (FIG. 4B) further configured as a hollow tube that may be configured with an aperture 37H (as shown in FIG. 2C) aligned with the groove 37G, and a similar aperture 37H may be provided in the hub 49 corresponding to each groove 37G. The hollow shaft 46, aperture 37H and groove 37G are configured to supply the fluid to the surfaces 36 to facilitate the cleaning of the surfaces 26 of the disc.

In further review, FIG. 6A shows one embodiment with the brush member (i.e., brush 30-4) configured to define separate axial segments 32-4. Each segment 32-4 may comprise one turn 39 (FIG. 6E) around the axis 34, with the turn being from about 350 to about 360 degrees around the axis. The brush 30-4 is shown further comprising a shaft configured with a plurality of the separate hollow splines (pipes 108) coaxial with the axis 34. Each segment 32-4 is axially adjacent to another segment 32-4 along the shaft (see 115-1, etc.) and may comprise the hollow manifold chamber 120 configured with the spline slots 116S configured to receive the keys 111K of the hollow splines (pipes 108). In FIG. 6F a particular one of the hollow splines (one pipe 108) and a corresponding one of the spline slots 116S are shown configured to communicate with a respective chamber 120 of a particular one of the segments 32-4 that is located at a particular location (e.g., near 32N, FIG. 6A) along the axis 34 so that each chamber 120 communicates with a different particular one of the hollow splines 108 (via a key 111K) and the corresponding one of the spline slots 116S. The shaft configured as the hollow pipes 108 is thus configured to both simultaneously rotate all of the segments 32-4 around the axis 34 and supply a different brushing fluid from each particular hollow spline 108 (key 111K of pipe 108) and corresponding spline slot 116S into a different respective chamber, e.g., of a segment 32-4 of a series 115-1.

In further review, FIGS. 5A & 5B show one embodiment of a brush segment 32 for scrubbing the workpiece 20. There, the vane 70 is shown extending helically around the axis 34 of rotation and radially away from the axis to define the first and second opposite helical sides 36N. The first brush member 32M-1 is configured to extend helically adjacent to the first helical side 36N. The second brush member 32M-2 is configured to extend helically adjacent to the second helical side 36N. The vane is further configured with the described characteristic of rigidity in the direction 34D parallel to the axis 34. Each of the first and second brush members 32M-1 & 32M-2 is secured to the respective opposite helical side 36N of the vane 70. In one embodiment shown in FIGS. 6A-6H, each of the brush members is further configured with a helical mounting surface that is adhered to the respective opposite helical side 36N of the vane 70. The adhering may be by the apertures 132 shown in FIG. 6G, and the bridges 134 extending into a respective one of the apertures 132 to join at 134J to adhere one helical side of the respective first and second brush members 32M-F1 and 32M-F2 to the respective opposite helical sides 118S of the vane 118. The vane 118 may be configured from the two dishes 118D, each dish defining an interior wall 118W and one of the opposite helical sides 118S. Each dish 118D may be configured with an array of bosses 130 extending from the respective surface 118S. The dishes 118D are oriented to mate a respective boss 130 of each dish, and in FIG. 6G the orientation is with the respective apertures 132 of the mated bosses 130 aligned. Thus, each of the first and second brush members 32M-F1 and 32M-F2 may comprise the one joined bridge 134J extending into the aligned apertures 132 that are effectively the same one aperture. The bridges joined at 134J retain the dishes 118D together and secure the respective first and second brush members to the respective opposite helical side of the vane 118. The dishes 118D may also be joined together by bonding or welding.

In further review, in one embodiment the interior walls 118W of the retained dishes are spaced to define the hollow fluid distribution manifold 120, and the opposed helical sides (e.g., walls 118W) are configured with the fluid distribution outlets (e.g., 128, or porous walls) extending from the hollow fluid distribution manifold 120 to the respective secured first and second brush members 32M-F1 & 32M-F2. At least one of the dishes 118D (e.g., FIG. 6G, via the hub 116) is configured with the fluid inlet port 116H communicating with the hollow fluid distribution manifold 120.

In further review, in one embodiment FIG. 6B shows that the brush segment 32-4 is configured with the first end 42 and the second end 44. These ends 22 & 24 may be offset from each other in the direction 34D of the axis 34 as shown in FIG. 6E, and a value of the offset defines a pitch (see pitch length PL in FIG. 5A, for example, of the helical extension of the vane, e.g., 70) around the axis 34. In one embodiment, FIGS. 3B & 6E shows that each of the first end 42 and the second end 44 of the vanes 70 or 118 may be configured with the interlock 45. In this manner, the brush segments 32 may be arranged next to each other along the axis 34 with the first end 42 of one segment (e.g., 32V) joined by the interlock 45 to the second end 44 of the second segment (e.g., 32W).

In further review, in one embodiment FIGS. 5C & 6A show the plurality of the brush segments 32-4, the segments including a first brush segment (e.g., 32A) and a second brush segment (e.g., 32B). Each of the first and second brush segments may be further configured for orientation with the other brush segment in the adjacent relationship in the direction of the axis 34, as shown in these FIGs. The configurations for this orientation may include the hubs (49, FIG. 3B; 72, FIG. 5B; or 116, FIG. 6D). In each case the hub of the first brush member is configured to abut the hub of the adjacent second brush member. With the hubs abutting, the first brush member (e.g., 32M-1, FIG. 5B) of the first brush segment cooperates with the second brush member (e.g., 32M-2) of the second brush segment along the helical path (defined by many turns 39) to define the scrubber junction 48 extending along the helical path. As described with respect to FIG. 5C and applicable to the brush 30-4, for example, the first brush members 32M-1 of the first and second brush segments 32A and 32B (FIG. 5C) are configured in the continuous relationship extending helically around the axis 34 with ends 42 and 44 radially abutting. The second brush members 32M-2 of the first and second brush segments are similarly configured in the continuous relationship extending helically around the axis. FIG. 5C shows that the continuous first brush members 32M-1 are opposite to the continuous second brush members 32M-2 so that the junction scrubbing portions are portions of the turn 39 around the axis 34.

In view of the above descriptions, embodiments of the present invention may fill the above-described needs by providing methods and apparatus configured to clean the workpieces 20 quickly. As described above, the total number n of brush segments 32 may be selected in conjunction with selecting the rate RB and the pitch length PL. In this manner, the time period for cleaning and transporting one disc may be determined to be in a range of from about 1 minute to about 300 minutes. The time period for cleaning may vary depending on the configuration of the spiral scrubber and the cleaning parameters.

Additionally, the cleaning of the workpieces 20 may be at the shorter end of the above time period because of cleaning efficiencies resulting from the use of the particular configuration of the brush as described above. For example, as described, the discs 20 inserted into an exemplary brush 30-2 at the entrance 22 may be said to be previously uncleaned, and the disc may be coated with particles that may be best removed from the disc by a particular configuration C of a portion of the exemplary brush 30-2, or of any of the embodiments of the brush 30. Such portion of the brush 30-2 may be defined by any number N of adjacent brush segments 32, and the brush 30-2 with this configuration C was referred to as a "first type of brush". A number N of adjacent brush segments 32 of this configuration C was referred to as a "first type of brush segment". For the first type of brush the configuration was identified as C1, and because the configuration C1 is specifically for the first condition of the disc 20, the first scrubbing is performed efficiently (i.e., in less time) than by use of a brush configuration C that is generally-applicable to all types of uncleaned discs. The same type of improvement in scrubbing efficiency may result from use of a second type of brush, or third type of brush, or "n" type of brush, each differently configured so as to best remove a next type of particle or surface condition from the disc after first removal of underlying layers or particles or materials using the first type of brush configuration C1, for example.

Aspects of defining such a brush configuration may include selecting material characteristics from which one or more of the segments 32 may be fabricated (e.g., segments of various series 115-1, 115-2, etc., FIG. 6A. In one embodiment, the cylindrical member may be configured to extend from the entrance 22 to the exit 24. The least processed, or dirtiest, discs 20 are inserted into the brush 30 at the entrance 22 (location L0). If different cleaning (or scrubbing) characteristics C are to be provided (or are required) for more dirty discs than for cleaner discs, then the material characteristic selection aspect of defining the brush 30 may include the following, e.g., for a series 115 of segments 32. The material characteristics C may include the type of material, e.g., PVA, polyurethane, or nylon, etc. Additionally, such characteristics C may include thickness, desired forces FRT to be applied to the workpiece, the grooves (or channels) 37G (formed in the surfaces 36 to guide the brushing fluid), and surface topography. As an example, an axially thick piece of PVA may be selected to first gently brush off large particles from the workpiece, e.g., for series 115-1. This exemplary series 115-1 may be followed a second series 115-2 having characteristics suited to brushing after removal of the large particle(s). The material characteristics selection may thus provide second material characteristics C for the next series 115-2 of segments 32, axially next to (or adjacent to) the first series. This material selection may continue as to successive series 115 until the end 24 is reached. If different cleaning characteristics C need not be provided for more dirty discs than for cleaner discs, for example, an embodiment may provide all of the segments 32 of the brush 30 made from the same material characteristics C, which may be one or more of those identified above. Additionally, as described with respect to FIG. 6G, in one embodiment such characteristics C may be enhanced by supply of scrubbing fluid to the manifold chambers 120 of one series 115 according to the particular characteristic C.

Additionally, as described with respect to FIG. 6H, in one embodiment the scrubbing operations may be enhanced by supply of the brush cleaning fluid to certain sectors 126BC at the same time as scrubbing fluid is supplied to the sectors 126DC for scrubbing the discs 20.

In view of the above descriptions, embodiments of the present invention may fill the above-described needs by providing methods of and apparatus configured to increase the time provided for contact at the brush-workpiece interface of one particular brush 30 and one particular disc 20. For example, the number N of brush segments 32 configured with a particular exemplary configuration C2 may be increased as required to clean a particular layer, for example, of a disc 20. Thus, with other factors the same (i.e., with the same angle S and rate RB of brush rotation), a longer period of scrubbing time will be taken by the greater number N of segments 32 to scrub of the one particular disc 20 than with a lesser number N of segments 32. With the above-described efficiencies, including possible reduction of scrubbing time by some other segments 32 tailored for a particular other layer, and with possible increase of scrubbing time by fewer other segments having another exemplary configuration C4, both needs for quick scrubbing of the discs 20, and a longer scrubbing time of particular disc layers, may be accommodated while properly scrubbing and thus properly cleaning each of the discs may result.

In view of the above descriptions, embodiments of the present invention may also fill the above-described needs by providing apparatus configured to clean a group of workpieces, wherein all workpieces of the group are cleaned by the same apparatus, e.g., by the same brush 30. In review, each of the above embodiments is characterized by the one-by-one insertion of the discs 20 into the slits 31 or junctions 48 or 48-1 of the brush 30, such that the discs 20 of the group are one of a series of discs. As well, this cleaning by the same brush 30 may result from the described rotary abutting adjacency shown for example in FIG. 3D by the exemplary brush segments 32A and 32B configured in the helical shape, in which the end 42 of the first segment abuts the end 44 of the second segment 32B in the helical direction so the one segment 32 (e.g., 32B) is effectively a continuation of the prior segment 32 (e.g., 32A). Also, the cleaning by the same brush may result from the continuous helical sections of the brush 30, including for example the continuous vane 70, or continuous vane member 72, and continuous first brush member 32M-1 and continuous second brush member 32M-2 configured to rotate with the hubs interlocked. Also, for example the continuous vane 118, and the continuous first brush member 32M-F1 and continuous second brush member 32M-F2 may be configured to rotate with the hubs 116 interlocked by interlocks 45. During one exemplary rotation of the members 32M around the axis 34 and with respect to one location (e.g., one location L) along the axis 34 and at the given angle A (FIG. 4A), one of the scrubber junctions 48 (and the disc 20 in that junction 48) move in the direction 34D through a distance of one pitch length PL toward an exemplary end location Ln. The moving is conveying of the disc by that junction through the respective junction 48 (or slit 31) that extends helically through all of the brush segments 32 (or turns 39) of the one brush 30, such that all of the discs 20 of the group are cleaned by the same brush 20.

Although the foregoing invention has been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims. In the claims, elements and/or operation do not imply any particular order of operation, unless explicitly stated in the claims.

What is claimed is:

1. A brush having a spiral configuration for scrubbing a workpiece having opposite sides, the brush comprising:
a brush member having an axis of rotation, the brush member comprising a scrubbing material configured with a slit extending along a helical path relative to the axis of rotation, the slit being configured to define opposed helical scrubber surfaces, the opposed helical scrubber surfaces being configured to receive the workpiece, wherein the brush member is configured with a bore, and the bore is configured with at least one spline slot coaxial with the axis, wherein a shaft comprises one or more splines for reception in each respective one or more of the spline slots; and
the at least one spline slot and the one or more splines are further configured to support and apply rotational force to the brush member.

2. A brush as recited in claim 1, wherein the brush member is configured to convey the workpiece in a direction of the axis of rotation during the scrubbing.

3. A brush as recited in claim 1, wherein the brush member is configured to apply scrubbing forces to the opposite sides of the workpiece received by the opposed helical scrubber surfaces to effect scrubbing of the workpiece sides.

4. A brush as recited in claim 1, wherein the brush member is further configured with an entrance end and an exit end spaced along the axis, at the entrance end the slit being further configured to define an entrance brush segment portion configured to guide the workpiece into the slit.

5. A brush as recited in claim 1, wherein the brush member is further configured with an entrance end and an exit end spaced along the axis, at the exit end the slit being further configured to define a brush exit segment portion configured to facilitate removal of the workpiece from the slit.

6. A brush as recited in claim 1, wherein:
the brush member is configured with a bore coaxial with the axis; and
the brush further comprises a shaft configured for reception in the bore to rotate the brush member and the slit around the axis to cause the rotating slit and the received workpiece to move in a direction of the axis.

7. A brush as recited in claim 1, wherein the brush member is further configured with a body extending radially away from the shaft so that the opposed helical scrubber surfaces receive about one-third of the area of each of the opposite sides of the workpiece received in the slit so that upon rotation of the brush member around the axis the forces of the brushes on the workpiece cause the workpiece to rotate and the opposed helical scrubber surfaces scrub an entire area of each of the opposite workpiece sides.

8. A brush as recited in claim 1, wherein:
the brush member is configured to extend radially relative to the axis;
the slit extends along the helical path radially into the brush member to define the opposed helical scrubber surfaces;
the brush comprises a hollow shaft for mounting the brush member coaxial with the axis; and
the brush member is further configured for fluid communication between the hollow shaft and each of the opposed helical scrubber surfaces.

9. A brush as recited in claim 8, wherein:
the brush member is further configured with at least one groove in each of the opposed helical scrubber surfaces, the at least one groove extending radially; and
the shaft is further configured as a hollow tube with an aperture aligned with each groove.

10. A brush as recited in claim 1, wherein:
the brush member is configured with a manifold chamber;
the brush is further configured with a hollow shaft; and
the brush is further configured for fluidic communication from the hollow shaft to the manifold chamber and to the opposed helical scrubber surfaces.

11. A brush as recited in claim 1, wherein the brush member is configured to define separate axial segments, each segment comprising one turn and each segment being adjacent to another segment.

12. A brush as recited in claim 11, wherein:
the separate segments are configured so that a first pair of the adjacent segments is configured from scrubbing material having the same scrubbing characteristic;
the segments are configured so that a second pair of the adjacent segments is configured from scrubbing material having the same scrubbing characteristic; and
the scrubbing characteristics of the first and second pairs of segments is different.

13. A brush as recited in claim 11, wherein:
the brush further comprises a shaft configured with a plurality of separate hollow splines coaxial with the axis;
each axial segment comprises a hollow manifold chamber;
each manifold chamber is configured with spline slots;
each spline slot is configured to receive one of the hollow splines; and
a particular one of the hollow splines and a corresponding one of the spline slots are configured for fluidic communication with a respective chamber of a particular one of the segments that is located at a particular location along the axis so that each manifold chamber communicates with a different particular one of the hollow splines.

14. A brush as recited in claim 13 wherein the shaft is further configured to support and both simultaneously rotate all of the segments around the axis and supply a different fluid from each particular hollow spline and corresponding spline slot into a different respective chamber.

15. A brush as recited in claim 1, wherein:
the brush member is configured to extend radially relative to the axis;
the slit extends along the helical path radially into the brush member to define the opposed helical scrubber surfaces; and
each of the opposed helical scrubber surfaces is configured with a feature for scrubbing the opposite sides of the workpiece received between the opposed helical scrubber surfaces.

16. A brush segment for scrubbing a workpiece, the brush segment comprising:
a vane extending helically around an axis of rotation and radially away from the axis to define first and second opposite helical sides;
a first brush member configured to extend helically adjacent to the first helical side; and
a second brush member configured to extend helically adjacent to the second helical side, wherein the vane is configured with an array of apertures, each aperture extending from one opposite helical side to the other opposite helical side; and
each of the brush members comprises a helical mounting surface configured with a bridge extending into a respective one of the apertures, the bridges in each respective aperture being joined to adhere the respective first and second brush members to the respective opposite helical sides of the vane.

17. A brush segment as recited in claim 16, wherein each of the first and second brush members is secured to the respective opposite helical side of the vane.

18. A brush segment as recited in claim 16, wherein:
the vane is configured from two dishes, each dish defining an interior wall and one of the opposite helical sides;
each dish is configured with an array of bosses extending from the respective interior wall;
each boss is configured with an aperture;
the dishes are oriented to mate a respective boss of each dish, the orientation is with the respective apertures of the mated bosses aligned;
each of the first and second brush members comprises a bridge extending into the same one of the apertures; and
the bridges are joined to retain the dishes together and secure the respective first and second brush members to the respective opposite helical side of the vane.

19. A brush segment as recited in claim 18, wherein:
the interior walls of the retained dishes are spaced to define a hollow fluid distribution manifold;
the opposed helical sides are configured with fluid distribution outlets extending from the hollow fluid distribution manifold to the respective secured first and second brush members; and
at least one of the dishes is configured with a fluid inlet port communicating with the hollow fluid distribution manifold.

20. A brush segment as recited in claim 16, wherein:
the vane is configured with a first end and a second end;
the first and second ends are offset from each other in a direction of the axis; and
a value of the offset is about equal to a value of a pitch of the helical extension of the vane around the axis.

21. A brush segment as recited in claim 20, wherein:
each of the first end and the second end of the vanes is configured with an interlock; and
the brush segments are arranged next to each other along the axis with the first end of one segment joined by the interlocks to the second end of a second segment.

22. A brush segment as recited in claim 16, wherein each of the vane and the brush members is configured to extend helically one turn around the axis of rotation.

23. A brush for scrubbing a workpiece, the brush comprising:
a first brush segment and a second brush segment;
each brush segment comprising:
a vane extending helically around an axis of rotation and radially away from the axis to define first and second opposite helical sides, each vane being configured with a hub co-axial with the axis;
a first brush member configured to extend helically adjacent to the first helical side; and
a second brush member configured to extend helically adjacent to the second helical side;
with the respective hubs of the first brush segment and the second brush segment abutting, the vanes of the first and second brush segments define a continuous vane member extending helically in a plurality of adjacent turns around the axis;
each of the vanes being further configured with a particular pitch length to define a given space between adjacent turns of the continuous vane member; and
the first brush member of the first brush segment and the second brush member of the second brush segment are received in the space between the adjacent turns of the continuous vane member and define a helical scrubber junction as a continuous helical scrubber junction between the first and second brush segments.

* * * * *